(12) United States Patent
Lee et al.

(10) Patent No.: US 12,224,003 B2
(45) Date of Patent: Feb. 11, 2025

(54) FERROELECTRIC-BASED SYNAPTIC DEVICE AND METHOD OF OPERATING THE SYNAPTIC DEVICE, AND 3D SYNAPTIC DEVICE STACK USING THE SYNAPTIC DEVICES

(71) Applicant: Seoul National University R&DB FOUNDATION, Seoul (KR)

(72) Inventors: Jong-Ho Lee, Seoul (KR); Jeong-Hyun Kim, Seoul (KR)

(73) Assignee: SEOUL NATIONAL UNIVERSITY R&DB FOUNDATION, Seoul (KR)

( * ) Notice: Subject to any disclaimer, the term of this patent is extended or adjusted under 35 U.S.C. 154(b) by 139 days.

(21) Appl. No.: 18/117,108

(22) Filed: Mar. 3, 2023

(65) Prior Publication Data
US 2023/0282275 A1    Sep. 7, 2023

Related U.S. Application Data

(60) Provisional application No. 63/316,626, filed on Mar. 4, 2022.

(51) Int. Cl.
*G11C 11/54* (2006.01)
*G11C 11/22* (2006.01)
(Continued)

(52) U.S. Cl.
CPC .......... *G11C 11/54* (2013.01); *G11C 11/221* (2013.01); *H10B 43/30* (2023.02); *H10B 53/30* (2023.02)

(58) Field of Classification Search
CPC ... G11C 11/54; G11C 11/221; G11C 11/2259; G11C 11/223; G11C 11/2297; H10B 43/30; H10B 53/30; H10B 43/27; H10B 51/20; H10B 51/30; G06N 3/063; H01L 29/40111; H01L 29/40117; H01L 29/513; H01L 29/516; H01L 29/78391
See application file for complete search history.

(56) References Cited

U.S. PATENT DOCUMENTS

2006/0038242 A1*  2/2006  Hsu ................ H01L 29/516
                                                       257/407
2016/0308070 A1* 10/2016  Chang .................. H10B 51/30
(Continued)

FOREIGN PATENT DOCUMENTS

KR    20190130460    11/2019
WO    2014186529     11/2014

*Primary Examiner* — Jerome Leboeuf
(74) *Attorney, Agent, or Firm* — CANTOR COLBURN LLP

(57) ABSTRACT

Provided is a ferroelectric-based synaptic device and a three-dimensional synaptic device stack using the same. The synaptic device includes a source, a drain, a semiconductor body in which a channel region are formed, a gate electrode, and an insulating layer stack disposed between the semiconductor body and the gate electrode. The insulating layer stack includes: a charge trap layer disposed on the channel region of the semiconductor body and is made of a material capable of storing or trapping electric charges; a ferroelectric layer made of a ferroelectric material; and an insulating layer disposed between the charge trap layer and the ferroelectric layer. The synaptic device is characterized in that weight information is volatilely stored in the charge trap layer and non-volatilely stored in the ferroelectric layer.

14 Claims, 17 Drawing Sheets

(51) Int. Cl.
*H10B 43/30* (2023.01)
*H10B 53/30* (2023.01)

(56) References Cited

U.S. PATENT DOCUMENTS

2019/0334010 A1* 10/2019 Avci ................. H01L 29/78391
2022/0208259 A1* 6/2022 Gong ....................... G06N 3/08
2023/0064803 A1* 3/2023 Koo ................. H01L 29/66833

* cited by examiner

FERROELECTRIC-BASED SYNAPTIC DEVICE AND METHOD OF OPERATING THE SYNAPTIC DEVICE, AND 3D SYNAPTIC DEVICE STACK USING THE SYNAPTIC DEVICES

TECHNICAL FIELD

The present invention relates to a ferroelectric-based synaptic device, and more specifically, to a ferroelectric-based synaptic device and a 3D synaptic device stack using the ferroelectric-based synaptic device characterized in that device deterioration generated during cycling can be reduced to improve the durability. In the ferroelectric-based synaptic device according to the present invention, an insulating layer stack functioning as the memory of the synaptic device is configured to be composed of a charge trap layer and a ferroelectric layer and remove a tunneling insulating layer in order to temporarily store weight information in the charge trap layer and then store it in a non-volatile state in the ferroelectric layer.

BACKGROUND ART

In recent years, many approaches have been made to imitate nervous systems of animals as power consumption has increased significantly and heat release problems have become more serious in integrated circuits based on the Von Neumann architecture. Particularly, in the techniques imitating the nervous systems of animals, it is possible to improve the cognitive function and the determining function by enabling cognitive function and learning while greatly reducing power consumption. As a result, there is an opportunity to replace or greatly improve the functionality of the existing Von Neumann integrated circuits.

In particular, research on a neuromorphic system that enables parallel processing of enormous data is being actively conducted. In the neuromorphic technology that imitates the nervous system of animals, it is possible to improve cognitive function and judgment function by greatly reducing power consumption, strengthening cognitive function and enabling learning. Therefore, much attention has been increasingly paid to the techniques, and the need for research has been greatly increased.

Conventional techniques for imitating a synapse using a flash memory device mostly have a structure in which a tunneling insulating layer is placed on a channel of an FET-type device and charges trapped in a charge trap layer are prevented from escaping.

Meanwhile, in an operation for artificial intelligence AI, a calculation such as a weighted sum must be performed, and during this calculation process, the conductance of the synaptic devices in the synaptic array (threshold voltage in the case of FET) is repeatedly increased or decreased. This process is called 'cycling operation'. This cycling operation damages the tunneling insulating layer of the flash memory device having a conventional structure, and as a result, performance of the flash memory device deteriorates.

In order to solve this problem, the present invention proposes a new approach to store updated weight values in a ferroelectric material and greatly improving cycling characteristics by adding a ferroelectric layer instead of removing the tunneling insulating layer in the conventional flash memory device.

SUMMARY OF THE INVENTION

In order to solve the above problems, an object of the present invention is to provide a ferroelectric-based synaptic device that can prevent deterioration due to cycling operation of synaptic devices and improve durability of the devices. Therefore, the ferroelectric-based synaptic device according to the present invention is configured to implement a memory using a ferroelectric layer so that weight sum information can be stored in a non-volatile state in the ferroelectric layer.

Another object of the present invention is to provide a 3D synaptic device stack implemented using the ferroelectric-based synaptic devices.

According to a first aspect of the present invention, there is provided a ferroelectric-based synaptic device comprising: a source: a drain: a semiconductor body in which and a channel region is formed: a gate electrode; and an insulating layer stack disposed between the semiconductor body and the gate electrode. The insulating layer stack of the ferroelectric-based synaptic device includes a charge trap layer made of a material capable of storing or trapping charges and disposed on the channel region of a semiconductor body: a ferroelectric layer made of a ferroelectric material; and an insulating layer disposed between the charge trap layer and the ferroelectric layer, wherein weight information of the ferroelectric-based synaptic device is volatilely stored in the charge trap layer and non-volatilely stored in the ferroelectric layer.

In the ferroelectric-based synaptic device according to the first aspect of the present invention described above, it is preferable that the insulating layer stack further includes a floating layer which is disposed between the insulating layer and the ferroelectric layer, is made of a material that can be stored or trapped charges and is electrically floated during operation.

In the ferroelectric-based synaptic device according to the first aspect of the present invention described above, it is preferable that the ferroelectric layer is composed of a single ferroelectric layer or two or more ferroelectric layers.

In the ferroelectric-based synaptic device according to the first aspect of the present invention described above, it is preferable that the ferroelectric layer comprises: first and second ferroelectric layers made of Hafnium Zirconium Oxide (HZO); and a third ferroelectric layer made of hafnium oxide or zirconium oxide and disposed between the first and second ferroelectric layers.

In the ferroelectric-based synaptic device according to the first aspect of the present invention described above, it is preferable that the insulating layer stack does not include a tunneling insulating layer between the channel region of the semiconductor body and the charge trap layer.

In the ferroelectric-based synaptic device according to the first aspect of the present invention described above, it is preferable that the insulating layer stack further includes an additional charge trap layer which is made of a material capable of storing or trapping charges and is disposed between the insulating layer and the charge trap layer. More preferably, the charge trap layer and the additional charge trap layer of the insulating layer stack are made of materials having different dielectric constants so that an electric field distribution between the gate electrode and the channel region can be adjusted.

In the ferroelectric-based synaptic device according to the first aspect of the present invention described above, it is preferable that the insulating layer stack further includes an additional charge trap layer which is made of a material capable of storing or trapping charges and is disposed between the insulating layer and the charge trap layer of the insulating layer stack. More preferably, the charge trap layer and the additional charge trap layer are configured such that energy depths of traps for storing charge are different from each other, so that they have different charge storage characteristics.

In the ferroelectric-based synaptic device according to the first aspect of the present invention described above, it is preferable that the insulating layer is made of a material in which charges cannot be stored or trapped.

In the ferroelectric-based synaptic device according to the first aspect of the present invention described above, it is preferable that the insulating layer stack further includes an additional insulating layer which is disposed between the insulating layer and the ferroelectric layer and is made of a material having a different dielectric constant from that of the insulating layer.

In the ferroelectric-based synaptic device according to the first aspect of the present invention described above, the insulating layer stack may further include an additional insulating layer made of a material capable of storing or trapping charges.

In the ferroelectric-based synaptic device according to the first aspect of the present invention described above, it is preferable that the source and the drain are preferably implemented by doping impurities in the surface of the semiconductor body or by electrically inducing.

In the ferroelectric-based synaptic device according to the first aspect of the present invention described above, it is preferable that the synaptic device is formed in a vertical structure or a horizontal structure, and the semiconductor body may be implemented by a semiconductor thin layer, an n-type or p-type semiconductor well, or a semiconductor substrate.

A method of operating a ferroelectric-based synaptic device according to a second aspect of the present invention is comprising the following steps: (a) storing charges corresponding to weight information of the ferroelectric-based synaptic device in a charge trap layer: (b) applying a pulsed voltage to a gate electrode: (c) polarizing the ferroelectric layer according to the amount of charges stored in the charge trap layer by the voltage applied to the gate electrode: (d) leaking the charges stored in the charge trap layer to the channel region: wherein the charges corresponding to the weight information of the ferroelectric-based synaptic device are temporarily stored in the charge trap layer, and the weight information of the synaptic device is non-volatilely stored in the ferroelectric layer.

In the method of operating the ferroelectric-based synaptic device according to the second aspect of the present invention described above, it is preferable that the step (a) includes the following steps: (a1) moving or accumulating charges in a channel region of a semiconductor body by current flow between a source and a drain; and (a2) storing charges of the channel region in the charge trap layer or moving charges of the charge trap layer to the channel region: wherein charges corresponding to the weight information of the synaptic device are temporarily stored in the charge trap layer.

In the method of operating the ferroelectric-based synaptic device according to the second aspect of the present invention described above, it is preferable that the ferroelectric-based synaptic device further comprises a floating layer which is capable of storing charges between the ferroelectric layer and the insulating layer and is made of a material having the dielectric constant greater than that of the insulating layer. More preferably, in the step (a), the charges corresponding to the weight information of the ferroelectric-based synaptic device are temporarily stored in the charge trap layer, and the charges stored in the charge trap layer are moved to the floating layer through the insulating layer and then stored in the floating layer.

A three-dimensional synaptic device stack according to a third aspect of the present invention includes: a substrate having an upper surface formed of an oxide layer: a channel hole disposed on the substrate, formed in a pillar shape provided in a direction perpendicular to the surface of the substrate, and filled with an insulating material: a semiconductor body disposed on the outer circumferential surface of the channel hole and made of a semiconductor material provided on the surface of the channel hole: a plurality of first insulating layers disposed on an outer circumferential surface of the semiconductor body: a plurality of sources disposed on a first side of an outer circumferential surface of the semiconductor body: a plurality of drains disposed on a second side of an outer circumferential surface of the semiconductor body opposite to the first side: a plurality of word lines disposed on a third side of an outer circumferential surface of the semiconductor body positioned between the sources and the drains: a plurality of insulating layer stacks disposed between the semiconductor body and the word lines: a source line electrode disposed on the substrate, formed in a pillar shape provided in a direction perpendicular to the surface of the substrate, and electrically connected to the plurality of sources; and a drain line electrode disposed on the substrate, formed in a pillar shape provided in a direction perpendicular to the surface of the substrate, and electrically connected to the plurality of drains.

The first insulating layers and the sources are alternately stacked on the first side of the outer circumferential surface of the semiconductor body, the first insulating layers and the drains are alternately stacked on the second side of the outer circumferential surface of the semiconductor body, and the first insulating layers and the word lines surrounded by the insulating layer stacks are alternately stacked on the third side of the outer circumferential surface of the semiconductor body.

The semiconductor body, the source, the drain, the insulating layer stack, and the word line located on the same layer of the surface of the channel hole constitute a synaptic device or a part of the synaptic device. The synaptic devices electrically isolated from each other by the first insulating layers are stacked to form a stack structure.

In the three-dimensional synaptic device stack according to the third aspect of the present invention described above, it is preferable that the insulating layer stack comprises: a charge trap layer made of a material capable of storing or trapping charges and disposed on a channel region of the semiconductor body: a ferroelectric layer made of a ferroelectric material; and an insulating layer disposed between the charge trap layer and the ferroelectric layer.

In the three-dimensional synaptic device stack according to the third aspect of the present invention described above, it is preferable that the insulating layer stack further includes a floating layer between the ferroelectric layer and the insulating layer.

In the three-dimensional synaptic device stack according to the third aspect of the present invention described above, it is preferable that the insulating layer stack is implemented that the charges corresponding to the weight information of the synaptic device are volatilely stored in the charge trap layer, and the weight information of the synaptic device stored in the charge trap layer is non-volatilely stored in the ferroelectric layer by applying a pulse voltage to the gate electrode.

A three-dimensional synaptic device stack according to a fourth aspect of the present invention includes: a substrate having an upper surface formed of a first oxide layer; a body electrode formed in a pillar shape provided in a vertical direction on the substrate and made of a conductive material; a plurality of first insulating layers disposed on an outer circumferential surface of the body electrode; a plurality of third oxide layers disposed on an outer circumferential surface of the body electrode and alternately stacked with the first insulating layers; a plurality of semiconductor bodies disposed on an outer circumferential surfaces of the third oxide layers, formed by coating a semiconductor material on the outer circumferential surfaces of the third oxide layers, electrically connected to the body electrode, and alternately stacked with the first insulating layers; a plurality of sources disposed on an outer circumferential surface of the semiconductor bodies located on a first side surface of the body electrode and alternately stacked with first insulating layers positioned on the first side surface; a plurality of drains disposed on an outer circumferential surface of the semiconductor bodies located on a second side surface of the body electrode opposite to the first side surface and alternately stacked with the first insulating layers located on the second side surface of the body electrode; a source line electrode formed in a pillar shape provided along a vertical direction on a substrate and electrically connected to the plurality of sources; a drain line electrode formed in a pillar shape provided along a vertical direction on a substrate and electrically connected to the plurality of drains; a plurality of word lines disposed on the outer circumferential surface of the semiconductor bodies located on the third side surface of the body electrode and alternately stacked with the first insulating layers; and a plurality of insulating layer stacks disposed between the semiconductor bodies and the word lines. The semiconductor body, the source, the drain, the insulating layer stack, and the word line located on the same layer of the outer circumferential surface of the body electrode constitute a synaptic device or a part thereof, and the synaptic devices which are electrically isolated from each other by the first insulating layers and the third oxide layers are stacked to form a stack structure.

In the three-dimensional synaptic device stack according to the fourth aspect of the present invention described above, it is preferable that the insulating layer stack comprises: a charge trap layer made of a material capable of storing or trapping charges and disposed on a channel region of the semiconductor body; a ferroelectric layer made of a ferroelectric material; and an insulating layer disposed between the charge trap layer and the ferroelectric layer.

In the three-dimensional synaptic device stack according to the fourth aspect of the present invention described above, it is preferable that the insulating layer stack further includes a floating layer between the ferroelectric layer and the insulating layer.

In the three-dimensional synaptic device stack according to the fourth aspect of the present invention described above, it is preferable that the insulating layer stack is implemented that charges corresponding to the weight information of the synaptic device are volatilely stored in the charge trap layer, and the weight information corresponding to the charges stored in the charge trap layer is non-volatilely stored in the ferroelectric layer by applying a pulse voltage to the gate electrode.

The ferroelectric-based synaptic device according to the present invention having the above-described configuration temporarily stores charges corresponding to the result of the sum of weights in the charge trap layer. In particular, since the ferroelectric-based synaptic device according to the present invention does not have a tunneling insulating layer between the charge trap layer and the channel region, the charge trap layer has leakage characteristics, which allows the charge trap layer to temporarily store calculation results of the sum of weights. The charges temporarily stored in the charge trap layer represent the weight information of the ferroelectric-based synaptic device.

In the ferroelectric-based synaptic device according to the present invention, when a pulse voltage is applied to the gate electrode in a state in which the charges corresponding to the calculated value are stored in the charge trap layer or the additional charge trap layer, the weight information corresponding to the stored charges can be stored in a non-volatile form in the ferroelectric layer.

That is, when a pulse voltage is applied to the gate electrode, the direction of polarization in the grains of the ferroelectric layer is affected according to the amount of charges stored in the charge trap layer. That is, the amount of the charges can be considered as a kind of weight. In addition, the weight information proportional to the quantity of the polarization is stored in a non-volatile form in the ferroelectric layer.

As a result, the information stored in a non-volatile form determines the threshold voltage of the FET device to determine the weight. The storage and removal operations of charges into/from the charge trap layer are repeated many times during the computational process. However, unlike synaptic devices according to conventional technologies, the ferroelectric-based synaptic device according to the present invention can have excellent durability because there is no tunneling insulating layer under the charge trap layer.

In addition, the ferroelectric-based synaptic device according to the present invention preferably further includes a floating layer capable of storing charges between the ferroelectric layer and the insulating layer. In the operation of storing information non-volatilely, charges stored in the charge trap layer may be stored in the floating layer through the insulating layer. For this operation, it is preferable that the insulating layer is made of a material having a relatively low dielectric constant.

The present invention can provide a ferroelectric-based FET-type synaptic device that enables many cycling operations required in AI computing without deterioration of the device by effectively converging the characteristics of a flash memory and a ferroelectric memory. Unlike conventional flash memory devices, since the ferroelectric-based synaptic device according to the present invention does not include a tunneling insulating layer between the channel region and the charge trap layer, it has leaky memory characteristics and greatly improves cycling characteristics. In addition, the synaptic device according to the present invention can store intermediate results or final results in a non-volatile form in a ferroelectric layer during a calculation process.

The present invention relates to a synaptic device capable of mimicking a synapse in neuromorphic technology. The synaptic device of the present invention can be used for low-power, high-density synapses and synapse arrays capable of on-chip learning, and has characteristics that can also be used for neuromorphic circuits.

DETAILED DESCRIPTION

Embodiments of a Ferroelectric-Based Synaptic Device

Hereinafter, the structure and operation of embodiments of a ferroelectric-based synaptic device according to the present invention will be described in detail with reference to the accompanying drawings.

Figure 1:
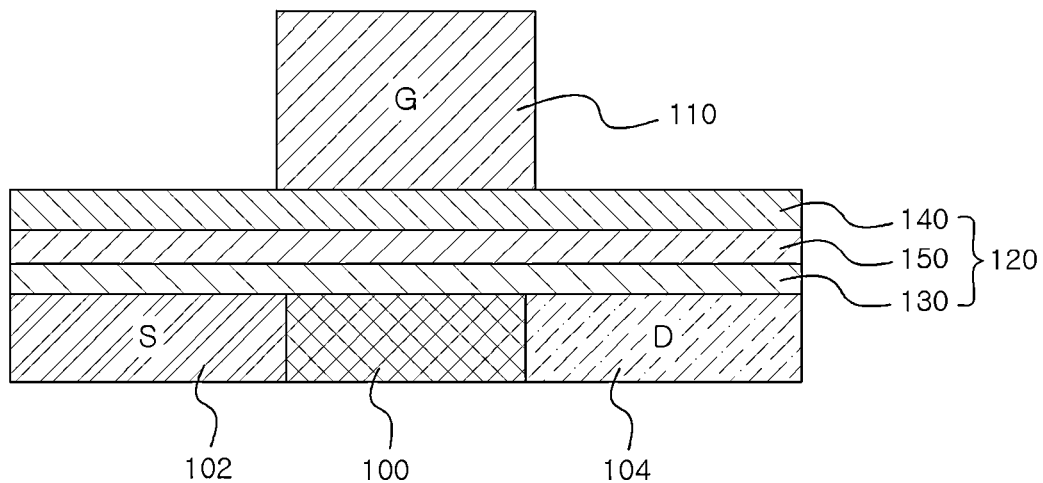
FIG. 1 is a schematic cross-sectional view of a first embodiment of a ferroelectric-based synaptic device according to the present invention.

Referring to FIG. 1, the first embodiment of a ferroelectric-based synaptic device according to the present invention will be described in detail.

FIG. 1 is a schematic cross-sectional view of a first embodiment of a ferroelectric-based synaptic device according to the present invention. Referring to FIG. 1, the first embodiment of the ferroelectric-based synaptic device according to the present invention includes a source(S) 102, a drain (D; 104), a semiconductor body 100 in which a channel region is formed, a gate electrode (G) 110 and an insulating layer stack 120 disposed between a semiconductor body 100 and a gate electrode 110. The insulating layer stack 120 includes a charge trap layer 130, a ferroelectric layer 140 and an insulating layer 150.

The insulating layer stack 120 does not include a tunneling insulating layer between the charge trap layer and the semiconductor body in which the channel region is formed. Therefore, the synaptic device has memory characteristics which the charges stored in the charge trap layer leak and cycling characteristics of the synaptic device are greatly improved. The ferroelectric-based synaptic device according to the present invention having the above configuration is characterized in that the charges corresponding to the weight information of the synaptic device are temporarily stored in the charge trap layer and the weight information corresponding to the stored charges is non-volatilely stored in the ferroelectric layer. Hereinafter, each component will be described in detail.

A channel region is formed in the semiconductor body, and the source and drain may be implemented by doping or electrically inducing impurities into the surface of the semiconductor body. The semiconductor body may be implemented by a semiconductor thin layer, an n-type or p-type semiconductor well or a semiconductor substrate.

The charge trap layer 130 of the insulating layer stack is made of a material capable of storing or trapping charges and is disposed on the channel region of the semiconductor body. A material such as $SiN_3$ and $HfO_2$ may be used as the charge trap layer.

The ferroelectric layer 140 of the insulating layer stack is made of a ferroelectric material. Materials such as Hafnium Zirconium Oxide (HZO), $HfO_2$, $BaTiO_3$, and $BiFeO_3$ may be used as the ferroelectric layer.

The insulating layer 150 of the insulating layer stack is disposed between the charge trap layer and the ferroelectric layer. Preferably, the insulating layer 150 is made of a material that cannot store or trap charges or is difficult to trap charges to prevent charges of the charge trap layer from being stored or trapped in the insulating layer. Therefore, the insulating layer 150 is preferably made of a material that does not trap or is difficult to store the charges, and materials such as $Al2O_3$, $TiO_2$, and $ZrO_2$ may be used for the insulating layer.

The ferroelectric-based synaptic device according to the present invention is characterized in that there is no tunneling insulating layer between the channel region of the semiconductor body and the charge trap layer. However, there may be a leaky insulating layer such as a native oxide layer that is unintentionally generated during the manufacturing process.

Figure 2:
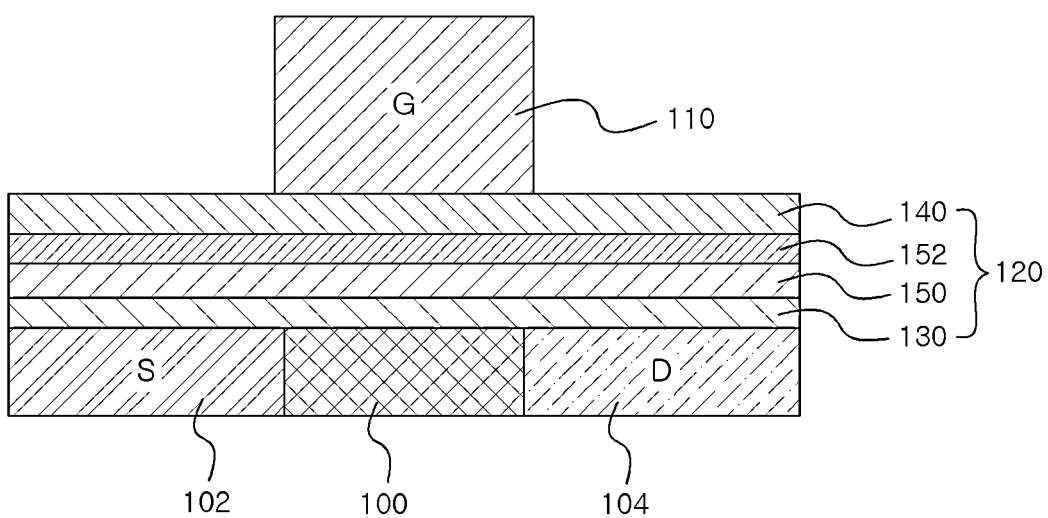
FIG. 2 is a cross-sectional view schematically showing a second embodiment of a ferroelectric-based synaptic device according to the present invention.

Since the ferroelectric-based synaptic device according to the present invention does not have a tunneling insulating layer between the channel region and the charge trap layer, even if charges frequently move between the channel region and the charge trap layer, device characteristics are not deteriorated. The synaptic device according to the present invention is configured to leak charges stored in the charge trap layer into the channel, whereas conventional flash memories are configured to store charges stored in the charge trap layer for a long time, FIG. 2 is a cross-sectional view schematically showing a second embodiment of a ferroelectric-based synaptic device according to the present invention. Referring to FIG. 2, the of the ferroelectric-based synaptic device of the present invention is similar to the overall structure of the synaptic device of the first embodiment except that second embodiment is characterized by further including an additional insulating layer 152.

The additional insulating layer 152 is disposed between the insulating layer 150 and the ferroelectric layer 140. Preferably, the additional insulating layer 152 is made of a material having a different dielectric constant from that of the insulating layer 150 so as to control electric field distribution between the gate electrode and the channel region. In addition, the additional insulating layer 152 may be made of a material capable of storing or trapping charges and may have a function of trapping charges.

Figure 3:
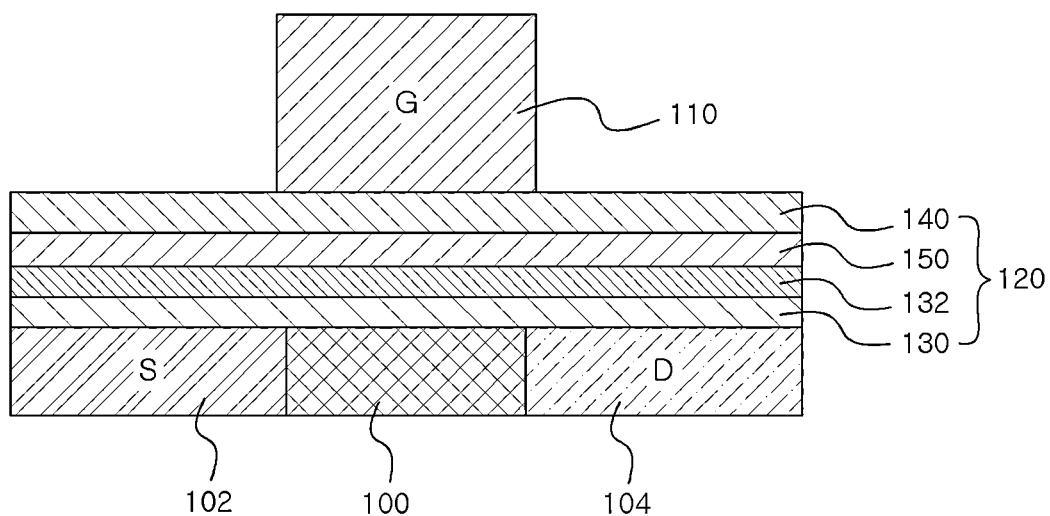
FIG. 3 is a schematic cross-sectional view of a third embodiment of a ferroelectric-based synaptic device according to the present invention.

Referring to FIG. 3, a third embodiment of the ferroelectric-based synaptic device according to the present invention will be described in detail. FIG. 3 is a schematic cross-sectional view of the third embodiment of the ferroelectric-based synaptic device according to the present invention. Referring to FIG. 3, the third embodiment of the synaptic device of the present invention is generally similar to the structure of the synaptic device of the first embodiment, but is characterized in that it further includes an additional charge trap layer 132.

The additional charge trap layer 132 is made of a material capable of storing or trapping charges, and is preferably disposed between the charge trap layer 130 and the insulating layer 150. Preferably, the additional charge trap layer 132 is made of a material having a different dielectric constant from that of the charge trap layer 130 so that an electric field distribution between the gate electrode and the channel region can be controlled.

In addition, it is preferable that the charge trap layer 130 and the additional charge trap layer 132 have different charge storage characteristics by configuring the energy depths of the charge traps to be different from each other.

Figure 4:
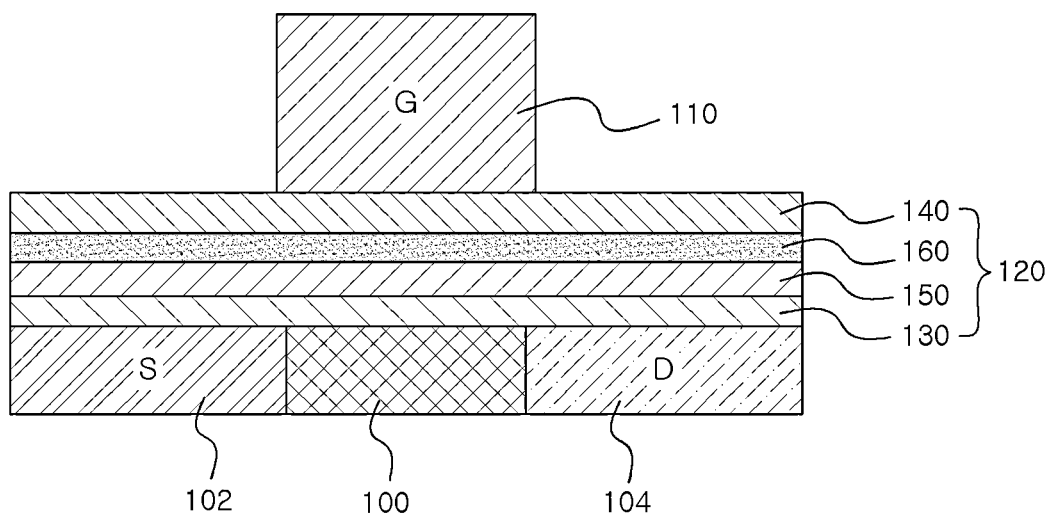
FIG. 4 is a cross-sectional view schematically showing a fourth embodiment of a ferroelectric-based synaptic device according to the present invention.

Referring to FIG. 4, a fourth embodiment of the ferroelectric-based synaptic device according to the present invention will be described in detail. FIG. 4 is a cross-sectional view schematically showing a fourth embodiment of a ferroelectric-based synaptic device according to the present invention.

Referring to FIG. 4, the ferroelectric-based synaptic device of the present invention is generally similar to the structure of the synaptic device of the first embodiment, but is characterized in that it further includes a floating layer 160 between the ferroelectric layer 140 and the insulating layer 150.

The floating layer 160 is made of a material capable of storing or trapping charges and is electrically floating during the device operation. The floating layer 160 may be made of a semiconductor, a metal, or a material capable of trapping charges. When the floating layer is made of a semiconductor, polysilicon or amorphous silicon may be used, or a semiconductor heavily doped with n-type or p-type may be used. For the floating layer, semiconductors such as Si and Ge, materials such as metal oxides, and $SiO_2$ may be used. When the floating layer is made of a metal, a single metal or a binary metal such as TiN and TaN may be used.

Figure 5:
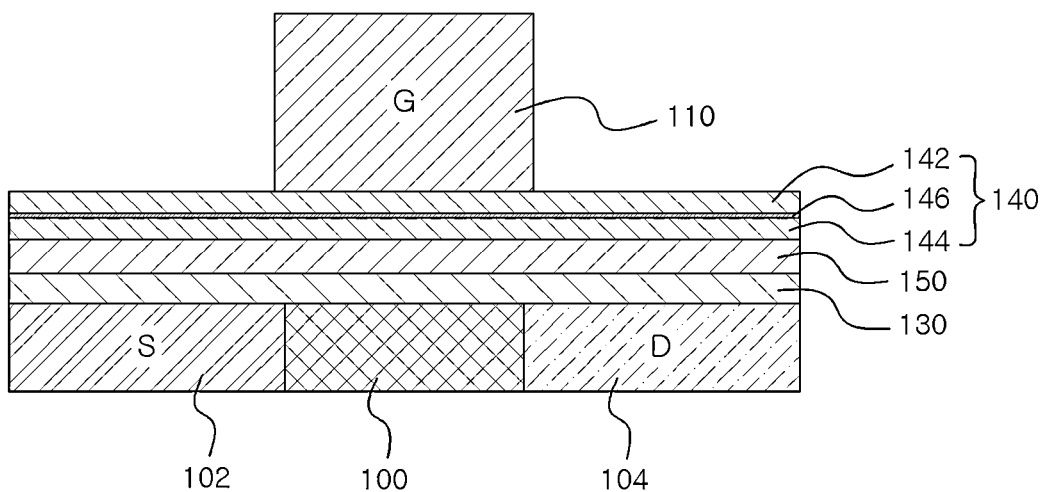
FIG. 5 is a cross-sectional view schematically showing a fifth embodiment of a ferroelectric-based synaptic device according to the present invention.

Referring to FIG. 5, a fifth embodiment of the ferroelectric-based synaptic device according to the present invention will be described in detail. FIG. 5 is a cross-sectional view schematically showing the fifth embodiment of a ferroelectric-based synaptic device according to the present invention. Referring to FIG. 5, the fifth embodiment of the ferroelectric-based synaptic device of the present invention is generally similar to the structure of the synaptic device of the first embodiment, except that the ferroelectric layer 140 is composed of two or more ferroelectric layers.

The ferroelectric layer 140 may include first and second ferroelectric layers 142 and 144 made of Hafnium Zirconium Oxide (HZO), and a third ferroelectric layer 146 disposed between the first and second ferroelectric layers. The third ferroelectric layer 146 may be made of Hafnium Oxide or Zirconium Oxide. As described above, by configuring the ferroelectric layer with two or more layers, the size of the grains constituting the ferroelectric layer can be reduced to reduce the variation in characteristics of the device. For example, when the ferroelectric layer is composed of Hafnium Zirconium Oxide (HZO), the uniformity of the device can be improved by reducing the grain size of the HZO layer by disposing a Zirconium Oxide layer or Hafnium Oxide layer in the middle of the HZO layer.

A fabrication process for implementing a ferroelectric layer having the above-described structure is exemplarily as follows. First, the Hafnium Oxide layer and the Zirconium Oxide layer are alternately and repeatedly formed using the Atomic Layer Deposition (ALD) process to implement the HZO ferroelectric layer. During forming the HZO ferroelectric layer, the Zirconium Oxide layer or the Hafnium Oxide layer is deposited more than one layer at a specific location of the HZO ferroelectric layer. As a result, a thin layer of Zirconium Oxide or Hafnium Oxide is formed at the specific location of the HZO ferroelectric layer. Therefore, in forming a ferroelectric layer such as HZO layer, a Hafnium Oxide or Zirconium Oxide layer is provided at a specific position of the HZO layer.

Since the synaptic device according to the present invention having the above structure can operate at a much lower voltage than the voltage for polarizing the ferroelectric layer, it is very useful for on-chip training.

In general, off-chip training refers to learning with software in a computing device and moving the learned weight values to a hardware device for operation, while on-chip training refers to both learning and operation being performed in a hardware device. On-chip training is a challenging technology that requires careful consideration of various technical issues of the device because learning must occur within the hardware device.

Therefore, when the synaptic device according to the present invention is applied to on-chip training, the weight values continue to be changed during the training process. Therefore, in order to change these weight value, a very low voltage such as 2~3 Volt is applied to the gate to change the amount of charges stored in the charge trap layer. Here, the reason why the voltage applied to the gate is considerably low is that the synaptic device according to the present invention does not have a tunneling insulating layer, so charges do not need to pass through the tunneling insulating layer. Accordingly, it is possible to store charges in the charge trap layer even with a low voltage.

The synaptic device according to the present invention stores the finally determined weight values when the on-chip training is finally completed. In addition, a high voltage is required when storing the finally determined weight values. At this time, if a single pulse voltage is applied to the gate in batches, polarization is induced in the ferroelectric layer. As a result, it is possible to store weight values by polarization.

However, when using a conventional FeFET for the on-chip training, a considerably high voltage such as 5V or more must be applied to store the continuously changing weight values in the ferroelectric layer during the training process. Therefore, the conventional FeFET causes considerably more power consumption than the synaptic device according to the present invention. Unlike this, the synaptic device according to the present invention is able to implement the on-chip training with low power.

Modified Embodiment of a Ferroelectric-Based Synaptic Device

Figure 6A:
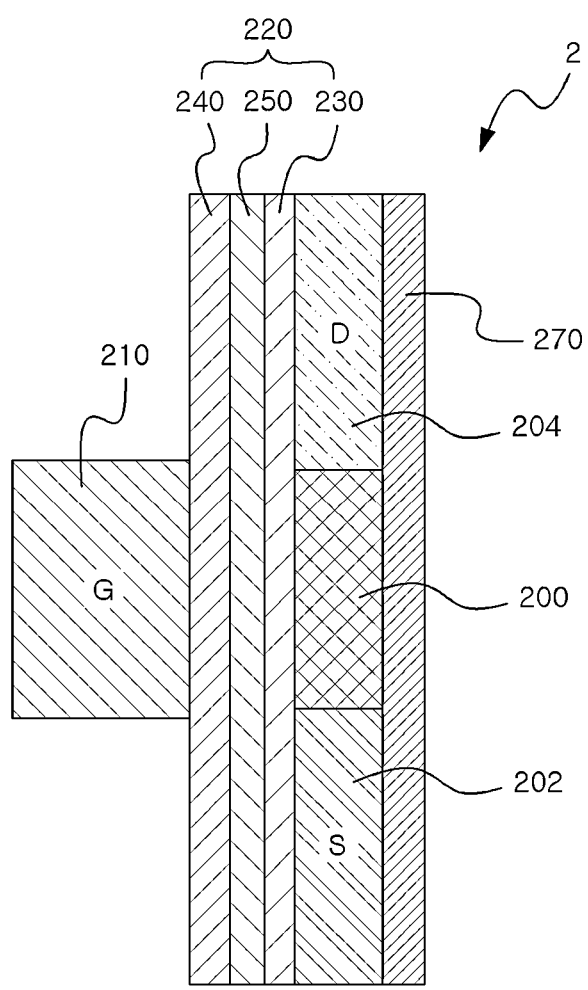
FIG. 6A and FIG. 6B are vertical and horizontal cross-sectional views schematically illustrating a modified embodiment of a ferroelectric-based synaptic device having a vertical structure according to a second embodiment of the present invention.
Figure 6B:
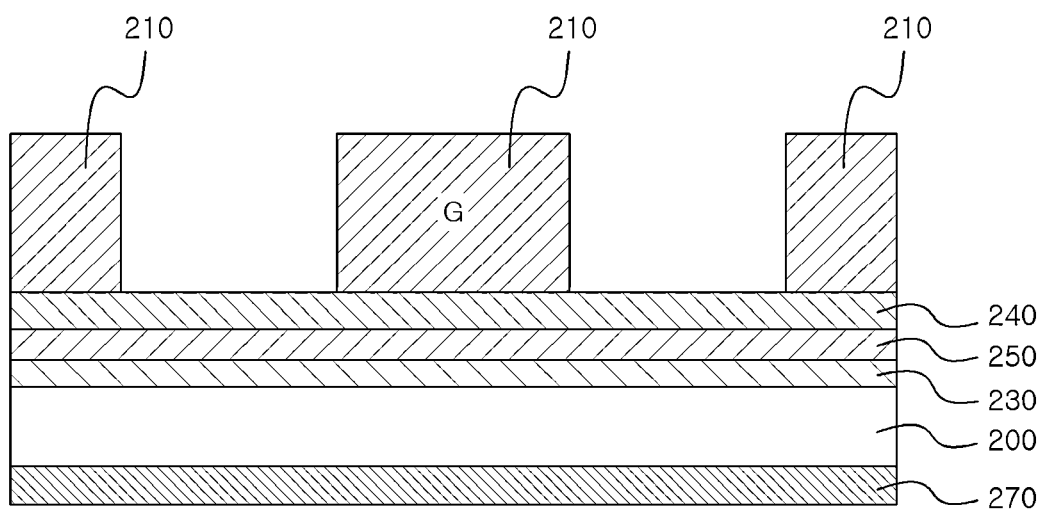

Referring to FIGS. 6A and 6B, a second embodiment of a ferroelectric-based synaptic device according to the present invention will be described in detail. The modified embodiment of the ferroelectric-based synaptic device according to the present invention is characterized in that the synaptic devices according to the first to fifth embodiments implemented in a horizontal structure are implemented in a vertical structure.

FIGS. 6A and 6B are vertical and horizontal cross-sectional views schematically illustrating a ferroelectric-based synaptic device having a vertical structure according to the present invention. FIGS. 6A and 6B, the ferroelectric-based synaptic device according to the present invention has a vertical structure, and includes an oxide layer 270, a semiconductor body 200 provided on the side of the oxide layer 270, a gate electrode 210 and an insulating layer stack 220 disposed between the side surface of the semiconductor body and the gate electrode 210. The insulating layer stack 220 comprises a charge trap layer 230, a ferroelectric layer 240 and an insulating layer 250 disposed between the ferroelectric layer 240 and the charge trap layer 230.

The semiconductor body 200 may be implemented in the form of a thin layer, and the charge trap layer 230 capable of trapping or storing charges is disposed on a side surface of the semiconductor body 200. The channel region is formed in the semiconductor body 200, and the source 202 and drain 204 may be implemented by doping impurities into the surface of the semiconductor body or by electrically inducing the impurities.

<Synapse Array Architecture>

Hereinafter, the synapse array architecture according to the present invention will be described in detail. A synapse array architecture with an AND, a NOR or a NAND structure according to the present invention can be implemented by arranging the ferroelectric-based synaptic devices according to the present invention in an array form.

Figure 7A:
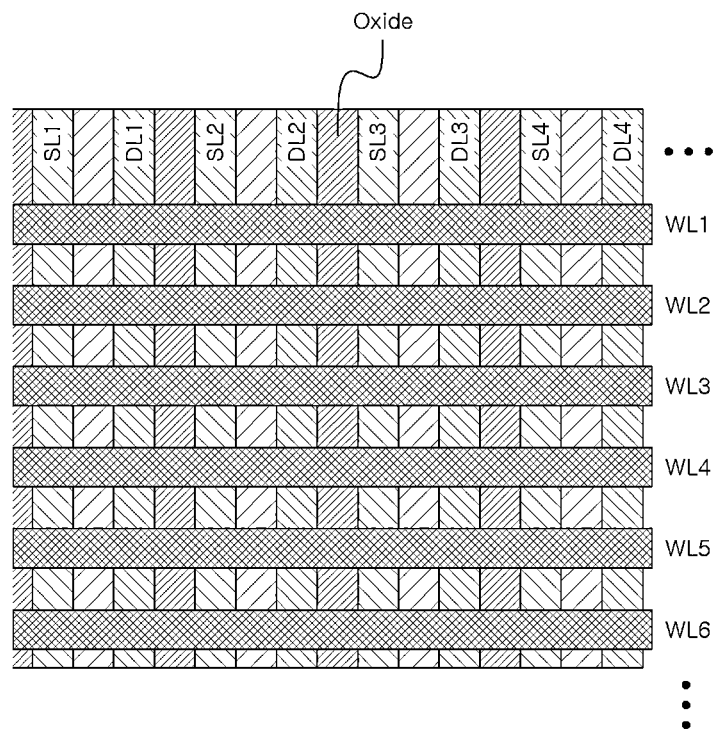
FIG. 7A and FIG. 7B are a plan view and a circuit diagram illustrating a synapse array architecture of an AND structure according to the present invention.
Figure 7B:
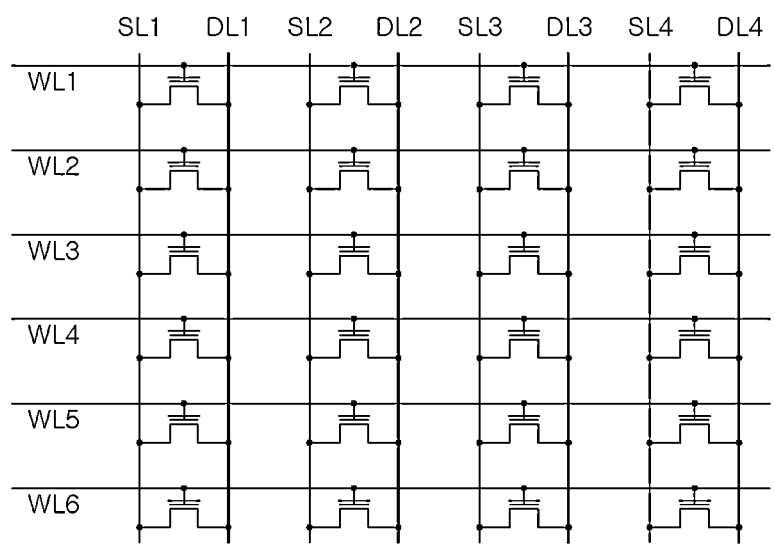
Figure 8A:
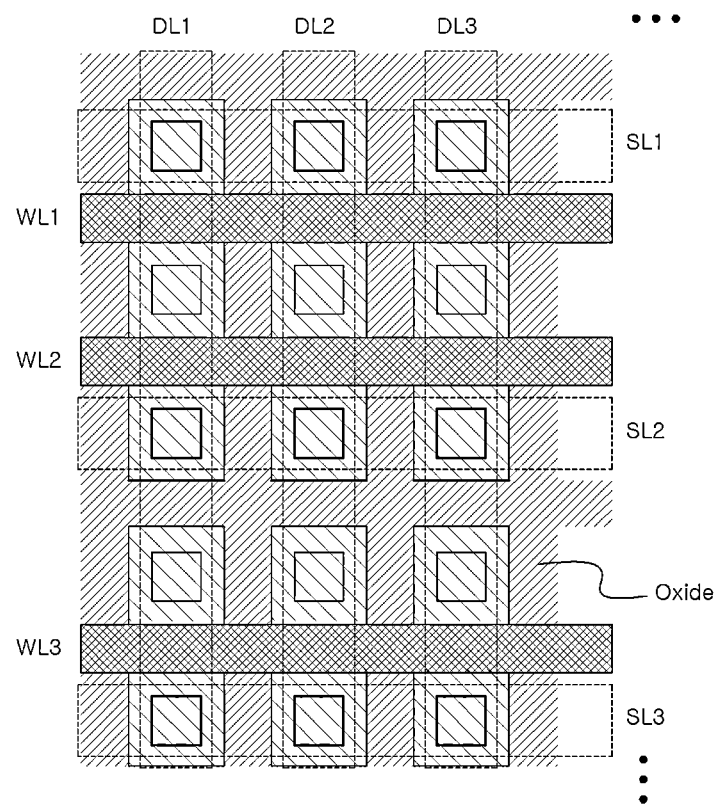
FIG. 8A and FIG. 8B are a plan view and a circuit diagram illustrating a synapse array architecture of a NOR structure according to the present invention.
Figure 8B:
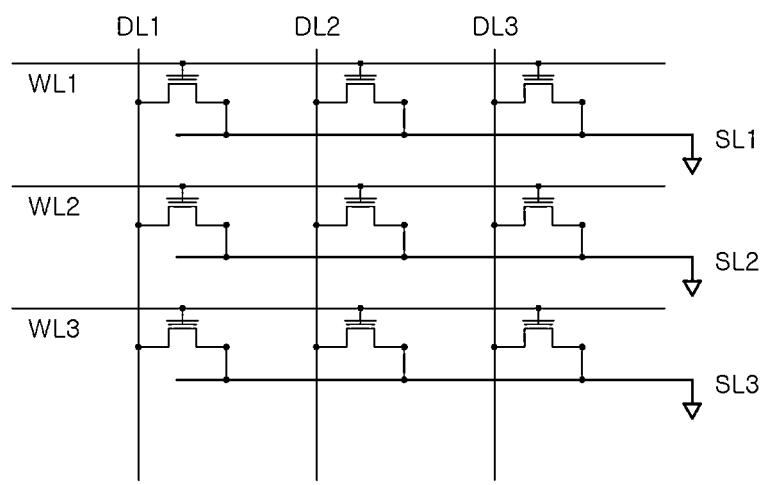

FIGS. 7A and 7B are a plan view and a circuit diagram illustrating a synapse array architecture of an AND structure according to the present invention. FIGS. 8A and 8B are a plan view and a circuit diagram illustrating a synapse array architecture of a NOR structure according to the present invention.

In the FIGS. 7A, 7B, 8A and 8B, it is possible to apply a voltage (usually 0 V based on nMOSFET) to the semiconductor body, but it is omitted for simplicity. Therefore, when it is necessary to apply a voltage to the semiconductor body, a separate terminal may be added to apply the voltage. SL is a line connecting the sources of the synaptic devices as a Source-Line, DL is a line connecting the drains of the synaptic devices as a Drain-Line, and WL is a line connected to the gate electrodes of the synaptic devices as a Word-Line.

Figure 9A:
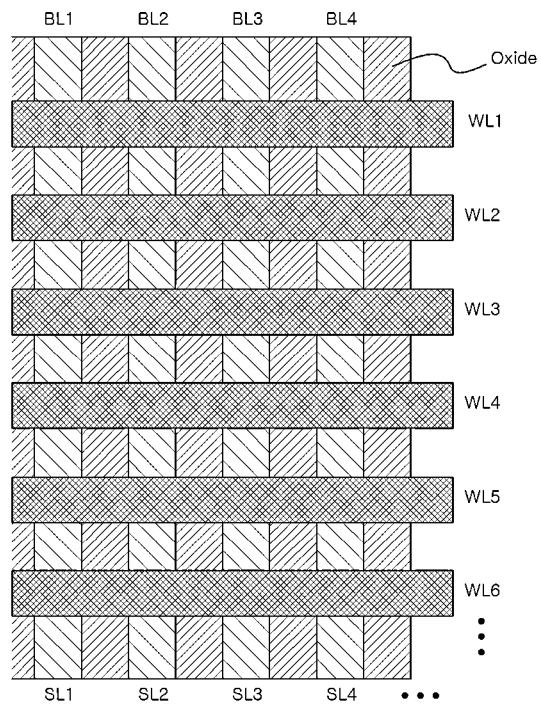
FIG. 9A and FIG. 9B are a plan view and a circuit diagram illustrating a synapse array architecture of a NAND structure according to the present invention.
Figure 9B:
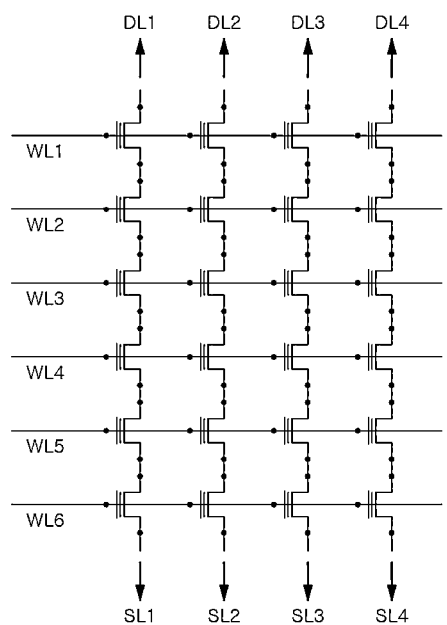

FIGS. 9A and 9B are a plan view and a circuit diagram illustrating a synapse array architecture of a NAND structure according to the present invention. Although it is possible to apply a voltage to the semiconductor body in FIGS. 9A and 9B, it is omitted for simplicity.

Therefore, when it is necessary to apply a voltage to the semiconductor body for operation such as program, erase, block erase, etc., the voltage can be applied by adding a separate terminal. At least one or more switch elements are included at both ends of the cell string, and the sources or the drains are connected to DL or SL through the switch elements. WL is a word-line and is a line connected to the gates of FET devices.

First Embodiment of 3D Synaptic Device Stack

Hereinafter, a 3D synaptic device stack according to the present invention will be described in detail. The 3D synaptic device stack according to the present invention can be implemented by arranging the ferroelectrics-based synaptic devices according to the present invention in a three-dimensional stack structure. The 3D synaptic device stack according to the present invention can implement a synaptic device stack having an AND, a NOR or a NAND structure and a three-dimensional stacked synapse array architecture using the same.

Figure 10:
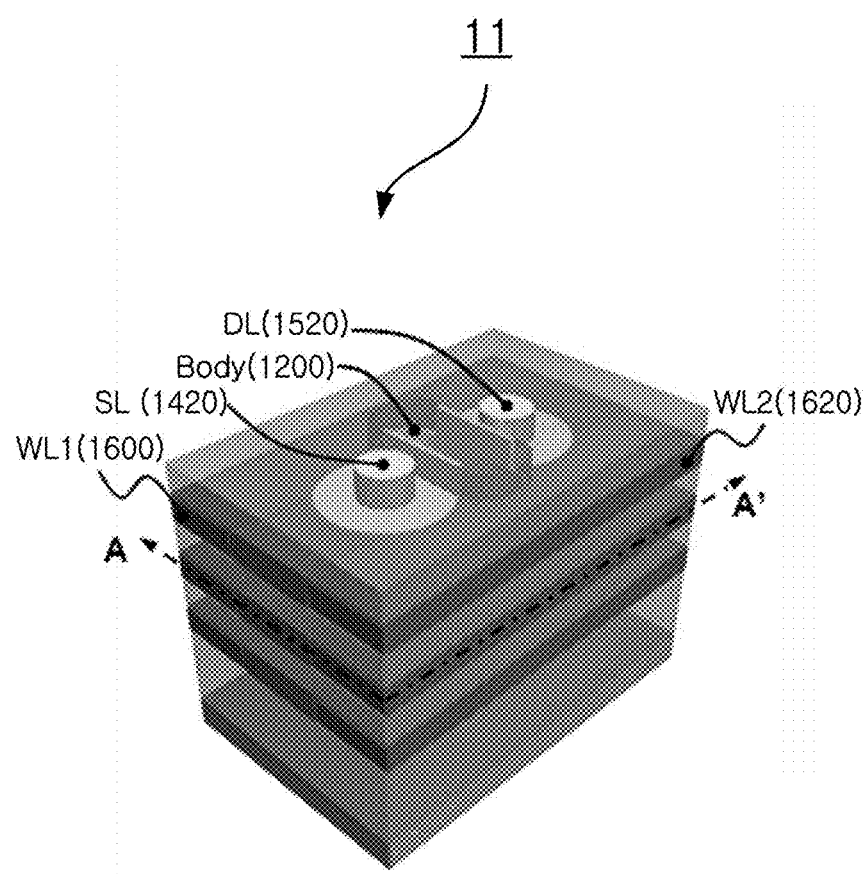
FIG. 10 is a perspective view showing a first embodiment of a 3D synaptic device stack according to the present invention.
Figure 11:
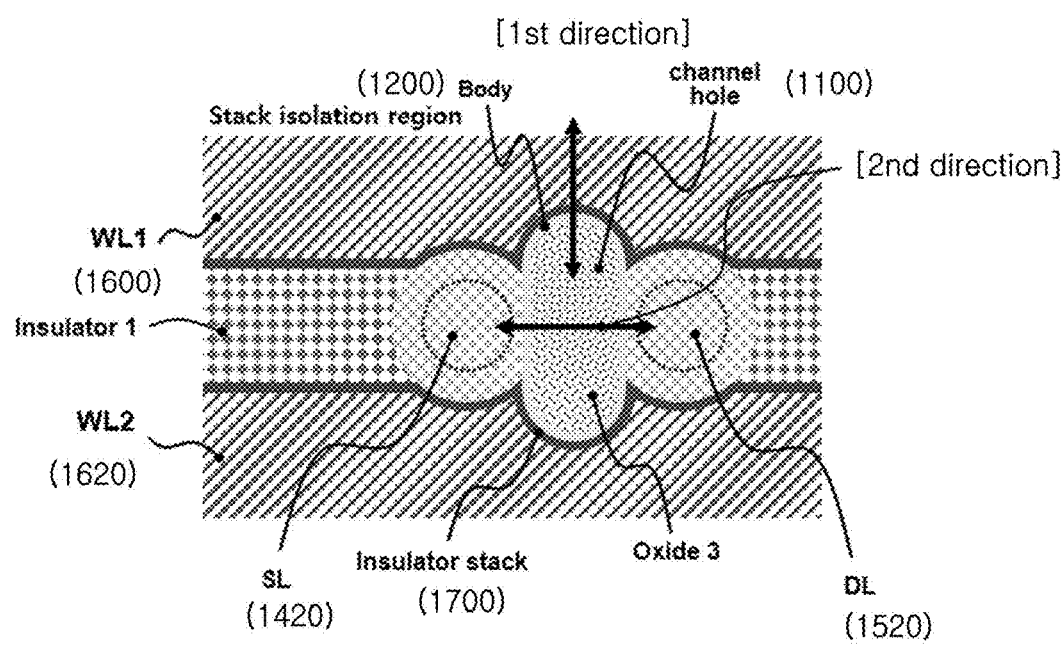
FIG. 11 is a cross-sectional view of the 3D synaptic device stack of FIG. 10 taken in an A-A direction.
Figure 12A:
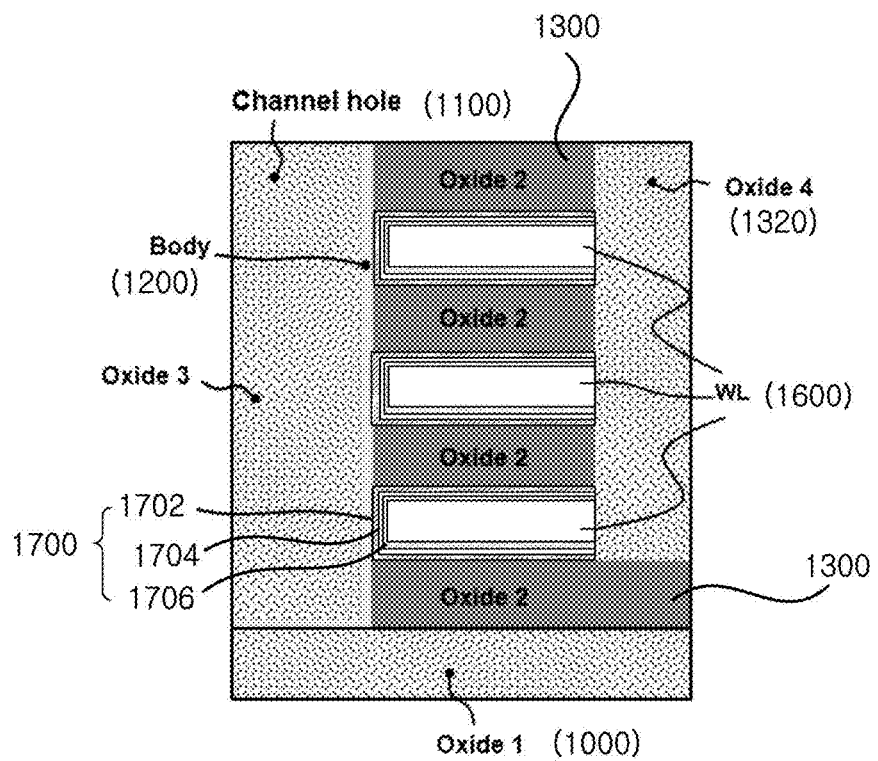
FIG. 12A and FIG. 12B are cross-sectional views of the 3D synaptic device stack shown in FIG. 11 in first and second directions in the first embodiment of a 3D synaptic device stack according to the present invention.
Figure 12B:
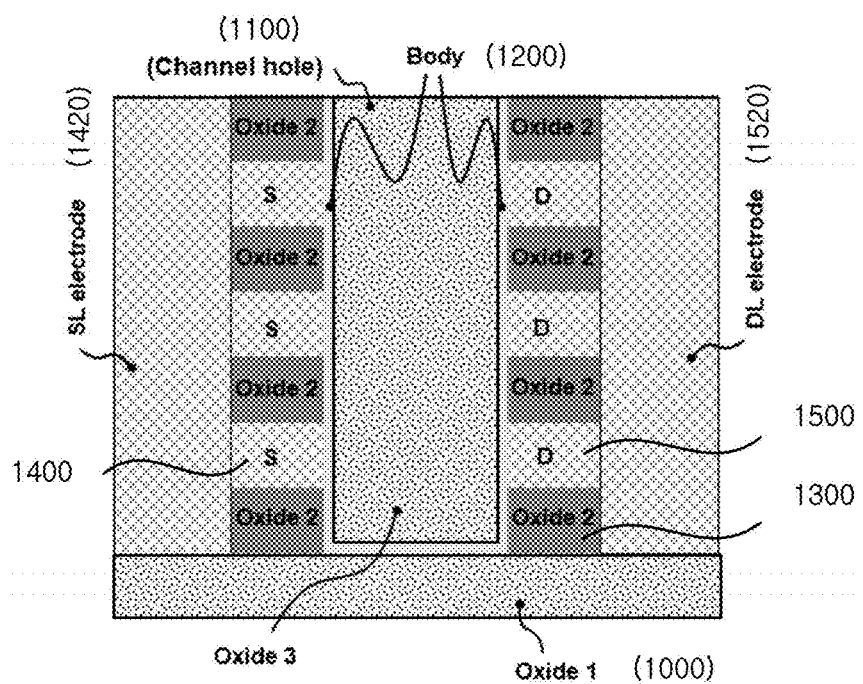

FIG. 10 is a perspective view showing a first embodiment of the 3D synaptic device stack according to the present invention, and FIG. 11 is a cross-sectional view of the 3D synaptic device stack of FIG. 10 taken in an A-A direction. FIGS. 12A and 12B are cross-sectional views in first and second directions of the 3D synaptic device stack shown in FIG. 11 in the first embodiment of the 3D synaptic device stack according to the present invention.

For convenience, in the present specification, the 3D synaptic device stack is described assuming that the synaptic device has a three-layer stacked structure. However, the 3D synaptic device stack according to the present invention is not limited to a three-layer stacked structure of synaptic devices, and may be manufactured as a stacked structure consisting of a plurality of layers as needed.

FIGS. 10 to 12, the 3D synaptic device stack 11 according to the present invention includes a substrate (not shown), a channel hole 1100, a semiconductor body 1200, a plurality of first insulating layers 1300, a plurality of sources 1400, a plurality of drains 1500, a source line electrode 1420, a drain line electrode 1520, a plurality of word lines 1600, and a plurality of insulating layer stacks 1700. A semiconductor body, a source, a drain, an insulating layer stack, and a word line located on the same layer on the side of the channel hole constitute a single synaptic device or a part thereof. The synaptic devices adjacent to each other are electrically isolated from each other by the first insulating layers. A plurality of synaptic devices electrically isolated from each other by the first insulating layers are stacked on a side surface of the channel hole in a vertical direction to form a single stack structure.

On the other hand, the first embodiment of the 3D synaptic device stack according to the present invention may further include an additional stack structure having the same structure as the stack structure on the side of the channel hole to improve the degree of integration. The additional stack structure includes additional word lines and additional insulating layer stacks, and is configured to share the sources, the drains, the source line electrode, and the drain line electrode of the stack structure.

The 3D synaptic device stack having the above structure further includes a fourth oxide layer 1320 on the surface of word lines to be electrically isolated from adjacent 3D synaptic device stacks. Hereinafter, each of the aforementioned components will be described in detail.

The surface of the substrate is formed of a first oxide layer 1000 (Oxide 1), and the three-dimensional synaptic device stack according to the present invention is provided on the first oxide layer of the substrate in the vertical direction.

The channel hole 1100 is disposed on the first oxide layer of the substrate and is formed in a pillar shape along a direction perpendicular to the first oxide layer of the substrate. The inside of the channel hole is filled with oxide material having electrical insulation to form a third oxide layer (Oxide 3).

The semiconductor body (Body) 1200 is disposed on the side surface of the channel hole, and is formed by coating a semiconductor material in the form of a thin layer on the side surface of the channel hole. The semiconductor body may be formed of a semiconductor material such as polysilicon, polySiGe, or metal oxide. The semiconductor body 1200 having the above structure is configured to form a channel during device operation.

The plurality of first insulating layers (Oxide 2) 1300 are disposed on the outer circumferential surface of the semiconductor body, and are spaced apart from each other and stacked along a vertical direction of the outer circumferential surface of the semiconductor body. The first insulating layer may be composed of, for example, an oxide layer. The first insulating layers are disposed between the stacked synaptic devices to electrically isolate the synaptic devices stacked on the side surface of the channel hole from each other.

The plurality of sources 1400 are disposed on a first side of the outer circumferential surface of the semiconductor body and are alternately stacked with first insulating layers positioned on the first side. The plurality of drains 1500 are disposed on a second side of the outer circumferential surface of the semiconductor body opposite to the first side along a second direction, and are alternately stacked with the first insulating layers positioned on the second side.

The word lines (WL) 1600 are disposed on third and fourth sides opposite to each other of the outer circumferential surface of the semiconductor body, which the third and fourth sides are located between the first and the second sides. The word lines 1600 are alternately stacked with first insulating layers. The insulating layer stack 1700 is provided between at least the word line and the semiconductor body, and may be further provided between the word line and the first insulating layer. Here, word lines positioned on the third side surface and word lines positioned on the fourth side surface configure different stack structures.

As shown in FIGS. 12A and 12B, along the first direction, the word lines surrounded by insulating layer stacks are alternately stacked with first insulating layers on the third and fourth side surfaces of an outer circumferential surface of a semiconductor body. In addition, along the second direction, the sources and drains are alternately stacked with the first insulating layers on the first and second sides of the outer circumferential surface of the semiconductor body, respectively. In this case, the semiconductor bodies in the first direction and the second direction are connected to each other, and word lines surrounded by the insulating layer stack are disposed between the sources and the drains.

The source line electrode (SL) 1420 is spaced apart from the first side of the outer circumferential surface of the semiconductor body by a predetermined distance and has a pillar shape provided along the vertical direction on the substrate. A side surface of the source line electrode is in contact with and electrically connected to side surfaces of the plurality of sources. The drain line electrode (DL) 1520 is spaced apart from the second side of the outer circumferential surface of the semiconductor body by a predetermined distance and has a pillar shape provided on the substrate in a vertical direction. A side surface of the drain line electrode is contacted with and is electrically connected to the plurality of drains.

The word lines (WL) 1600 are respectively disposed on opposite third and fourth sides of the outer circumferential surface of the semiconductor body positioned between the source and drain, and are alternately stacked with first insulating layers.

According to the structure of the 3D synaptic device stack according to the present invention, the semiconductor body, the source, the drain, the insulating layer stack, and the word line located on the same layer on the side of the channel hole constitute a single synaptic device or a part thereof. In addition, the synaptic devices formed on each layer are stacked while being electrically isolated from each other by the first insulating layers, thereby constituting a stack structure as a whole.

In addition, the additional insulating layer stack and the additional word line provided on the same layer on the side of the channel hole share the semiconductor body, the source, the drain, the source line electrode, and the drain line electrode of the synaptic device to form an additional synaptic device or a part thereof. In addition, the additional synaptic devices formed on each layer are stacked while being electrically isolated from each other by the first insulating layers, thereby constituting an additional stack structure as a whole.

Accordingly, two synaptic devices sharing a source and a drain may be formed on the same layer on the sides of the channel hole, and two synaptic device stacks separated from each other may be provided on the sides of the channel hole. The present invention can provide a basic synaptic device structure that can be effectively implemented in a three-dimensional stack structure, and the degree of integration can be improved by the above structure, and the performance of the device can also be improved. The 3D synapse device stack having the above-described structure can be applied to various array architectures, and can be preferably applied to an AND-type synapse array architecture or a NOR-type synapse array architecture.

Figure 13A:
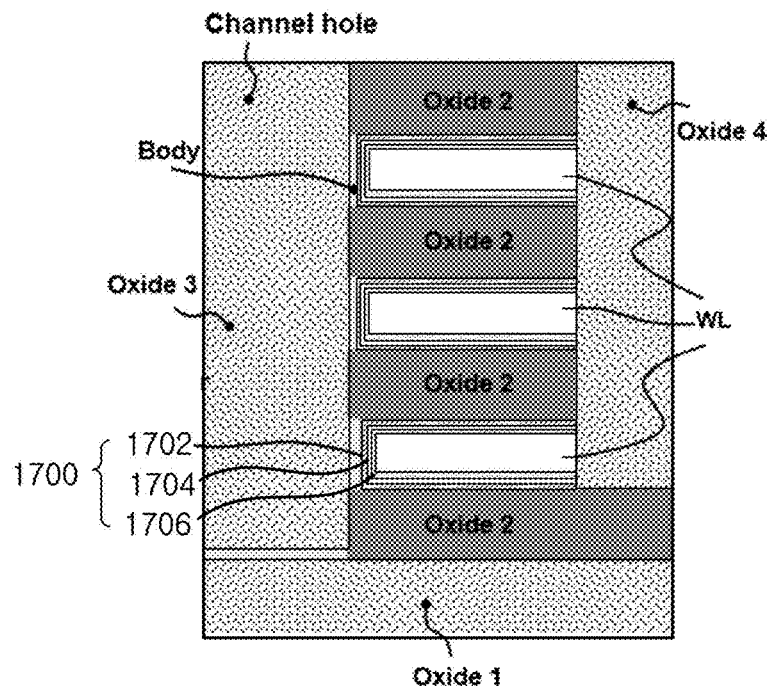
FIG. 13A and FIG. 13B are cross-sectional views in first and second directions illustrating another embodiment of a semiconductor body in the first embodiment of the 3D synaptic device stack according to the present invention.
Figure 13B:
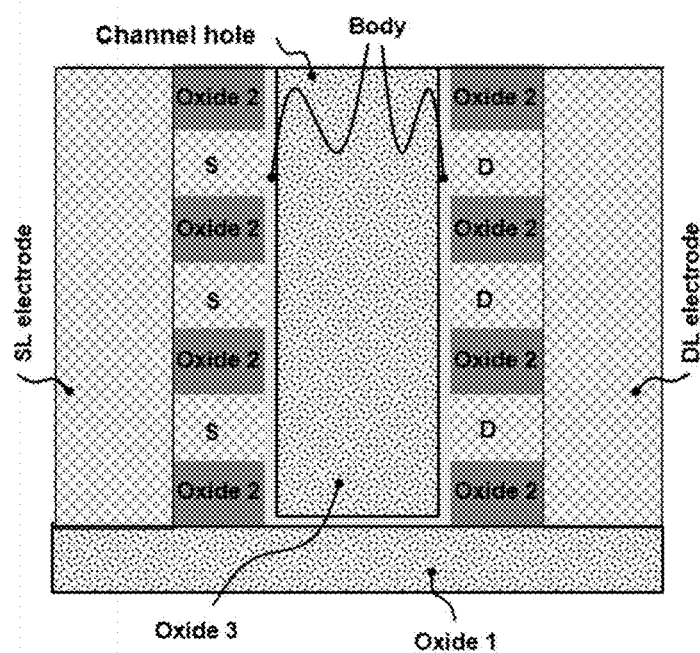

FIGS. 13A and 13B are cross-sectional views in first and second directions illustrating another embodiment of a semiconductor body in the first embodiment of the 3D synaptic device stack according to the present invention. Referring to FIGS. 13A and 13B, a semiconductor body is not provided on a side surface of the first insulating layer positioned between the stacked word lines. As described above, word lines adjacent to each other in the vertical direction are electrically isolated from each other by providing the semiconductor body only on the side surfaces of the word lines and not providing the semiconductor body on the side surface of the first insulating layer located between the word lines.

Figure 14A:
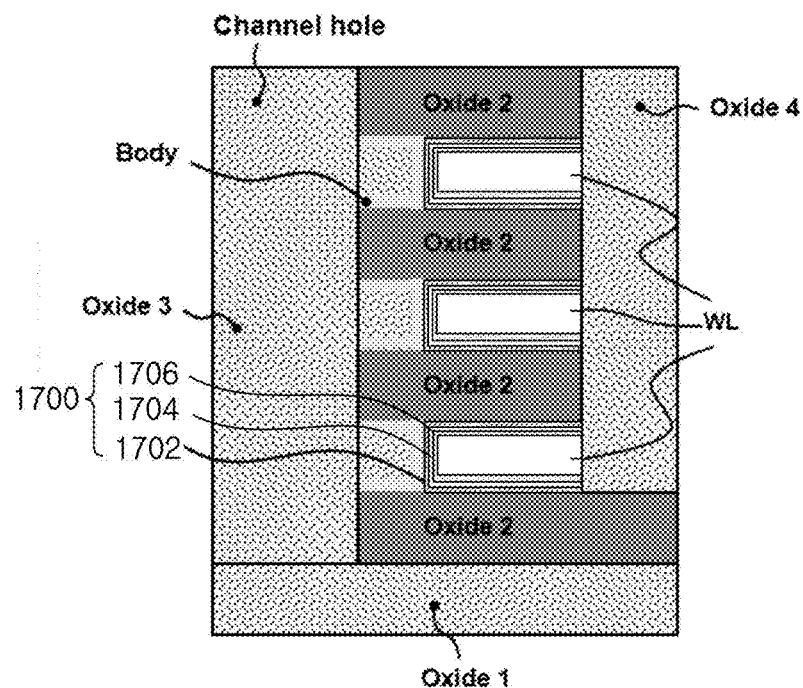
FIG. 14A and FIG. 14B are cross-sectional views illustrating another embodiment of a channel hole and a semiconductor body in the first embodiment of the 3D synaptic device stack according to the present invention.
Figure 14B:
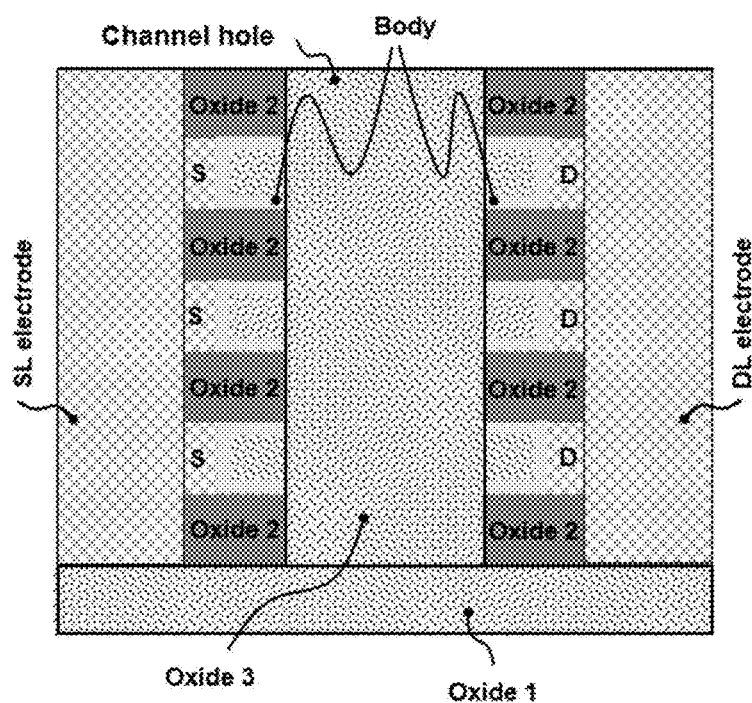

FIGS. 14A and 14B are cross-sectional views illustrating another embodiment of a channel hole and a semiconductor body in the first embodiment of the 3D synaptic device stack according to the present invention.

Referring to FIGS. 14A and 14B, a region where a synaptic device is formed among side surfaces of the channel hole protrudes and extends toward the source, drain, and word line. The semiconductor body is provided only on the surface of the protruding region of the side surface of the channel hole, and is not provided on the surface of the non-protruding region of the side surface of the channel hole. Therefore, a semiconductor body is not provided on the first side surface of the first insulating layer positioned between the stacked synaptic devices. In this way, by providing the semiconductor body on the surface of the word line and the surface of the source and drain, and not providing the semiconductor body on the surface of the first insulating layer in contact with the channel hole, the adjacent synaptic devices are electrically isolated from each other by the first insulating layer, and as a result, the performance of the device is improved.

Figure 15A:
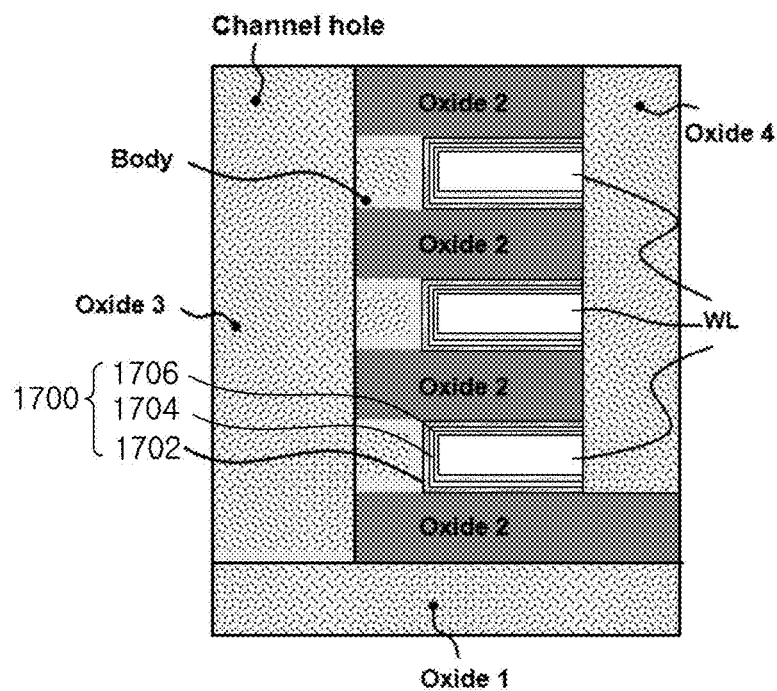
FIG. 15A and FIG. 15B are cross-sectional views illustrating another embodiment of a channel hole and a semiconductor body in the first embodiment of the 3D synaptic device stack according to the present invention.
Figure 15B:
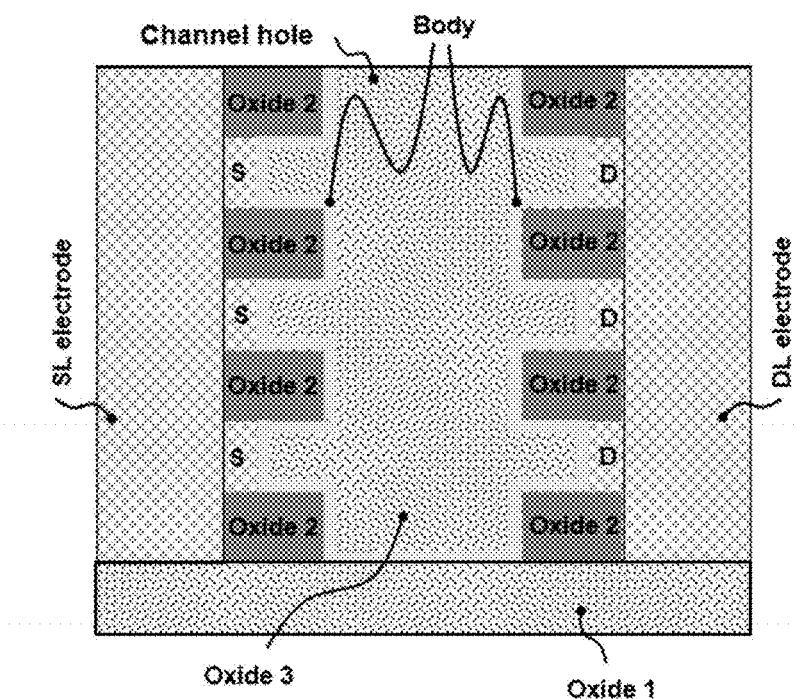

FIGS. 15A and 15B are cross-sectional views illustrating another embodiment of a channel hole and a semiconductor body in the first embodiment of the 3D synaptic device stack according to the present invention. Referring to FIGS. 15A and 15B, regions where the synaptic devices are formed on the side surface of the channel hole protrude and extend toward the sources, drains, and word lines. The semiconductor body is provided on a surface of a protruding region of the channel hole and a surface of a first insulating layer positioned between a source and a drain. In addition, the semiconductor body is not provided on a surface of the first insulating layer positioned between word lines stacked in a vertical direction.

As such, a semiconductor body is not provided on the surface of the first insulating layer positioned between the word lines. Due to this, the word lines of the vertically adjacent layers are electrically isolated from each other by the first insulating layer. As a result, the performance of the device is improved.

Figure 16A:
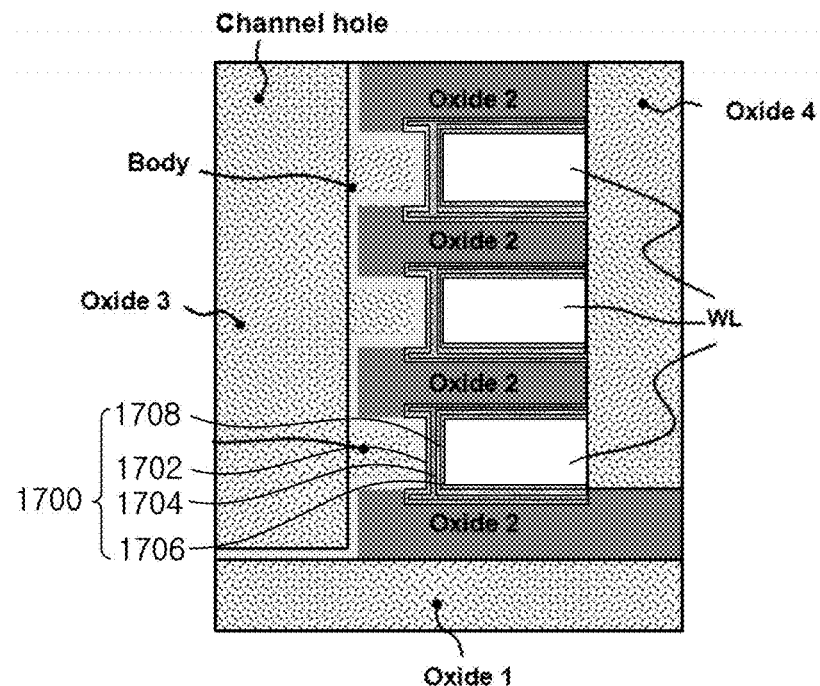
FIG. 16A and FIG. 16B are cross-sectional views illustrating another embodiment of a channel hole in the first embodiment of the 3D synaptic device stack according to the present invention.
Figure 16B:
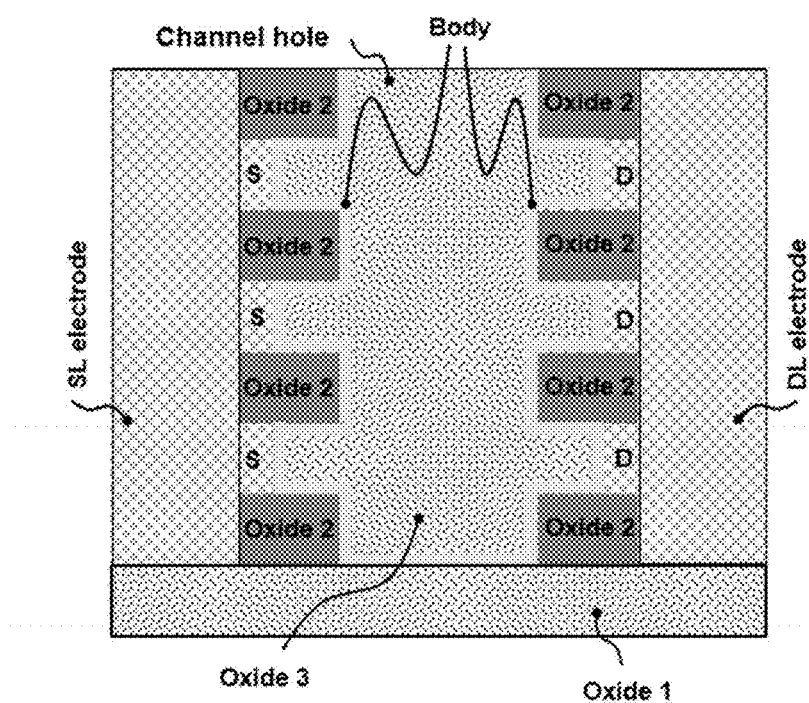

FIGS. 16A and 16B are cross-sectional views illustrating another embodiment of a channel hole in the first embodiment of the 3D synaptic device stack according to the present invention. Referring to FIGS. 16A and 16B, regions where the synaptic devices are formed on the side surface of the channel hole protrude and extend toward the sources, the drains, and the first and the second word lines. And, since the semiconductor body is provided on the entire side surface of the channel hole, the semiconductor body is formed of a thin layer in the form of a zigzag in a vertical direction.

In the first embodiment of the 3D synaptic device stack according to the present invention shown in FIGS. 12 to 16, the insulating layer stack (Insulator stack) 1700 is provided at least between the semiconductor body and the word line. In addition, the insulating layer stack may be further provided between the first insulating layer and the word line. Referring to FIGS. 12 to 16, the insulating layer stack 1700 of the synaptic device according to the present invention includes a charge trap layer 1702, an insulating layer 1704, and a ferroelectric layer 1706. The structure of the insulating layer stack is formed of the same structure as the insulating layer stack of the synaptic device according to the present invention described above.

Meanwhile, in the first embodiment of the 3D synaptic device stack according to the present invention, another embodiment of the insulating layer stack is characterized in that it further comprises a floating layer 1708 between the insulating layer 1704 and the ferroelectric layer 1706, as shown in FIGS. 16A and 16B. It is preferable that the capacitance between the WL and the floating layer is increased and the capacitance between the floating layer and the semiconductor body is decreased. This is a preferable structure when the ferroelectric layer is composed of two or more layers and the polarization is weak.

Due to the structure described above, the degree of integration can be improved, and the performance of the device can also be improved, The 3D synaptic device stack having the above-described structure according to the present invention can be applied to various array architectures, and can be preferably applied to an AND-type synapse array architecture or a NOR-type synapse array architecture.

Second Embodiment of a 3D Synaptic Device Stack

Figure 17:
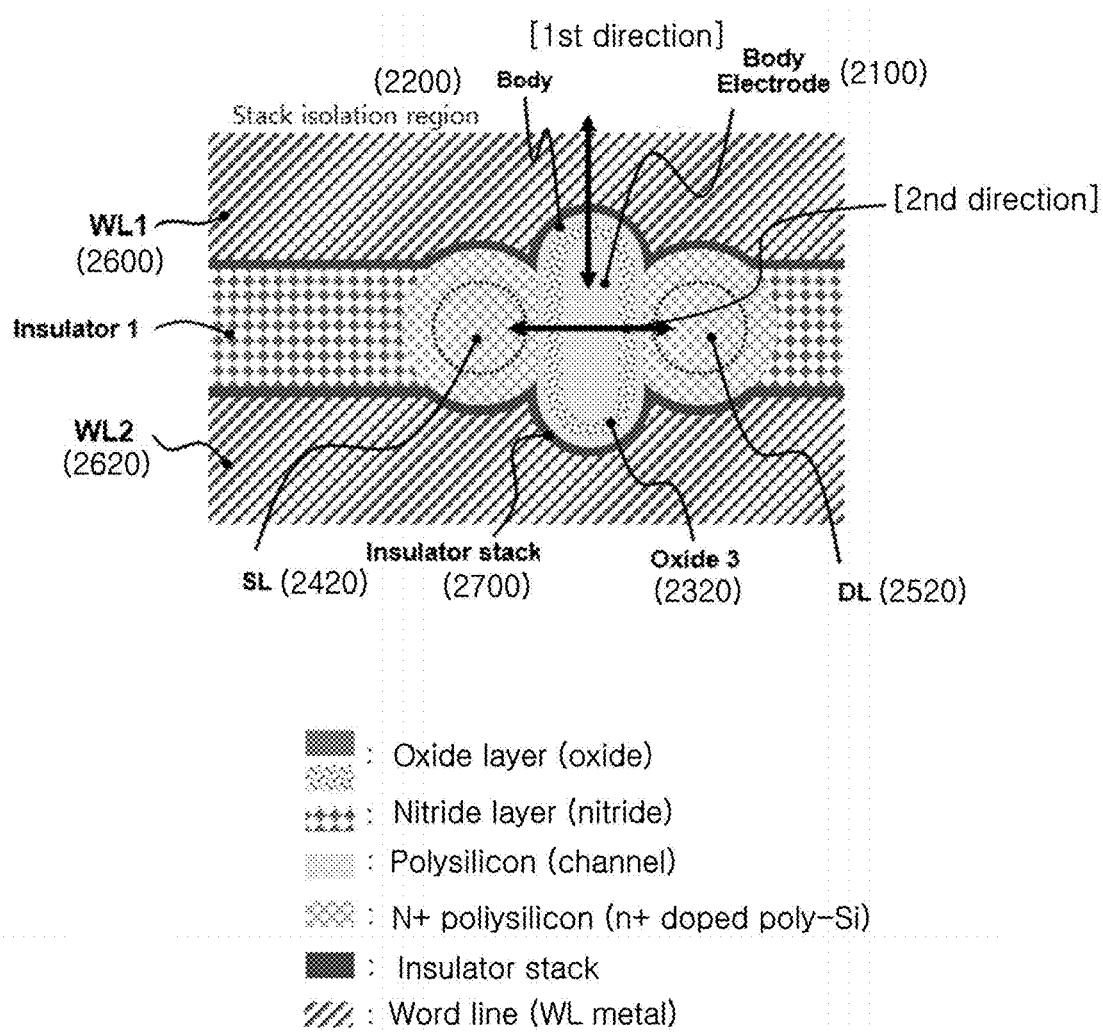
FIG. 17 is a horizontal cross-sectional view of a second embodiment of the three-dimensional synaptic device stack according to the present invention.
Figure 18A:
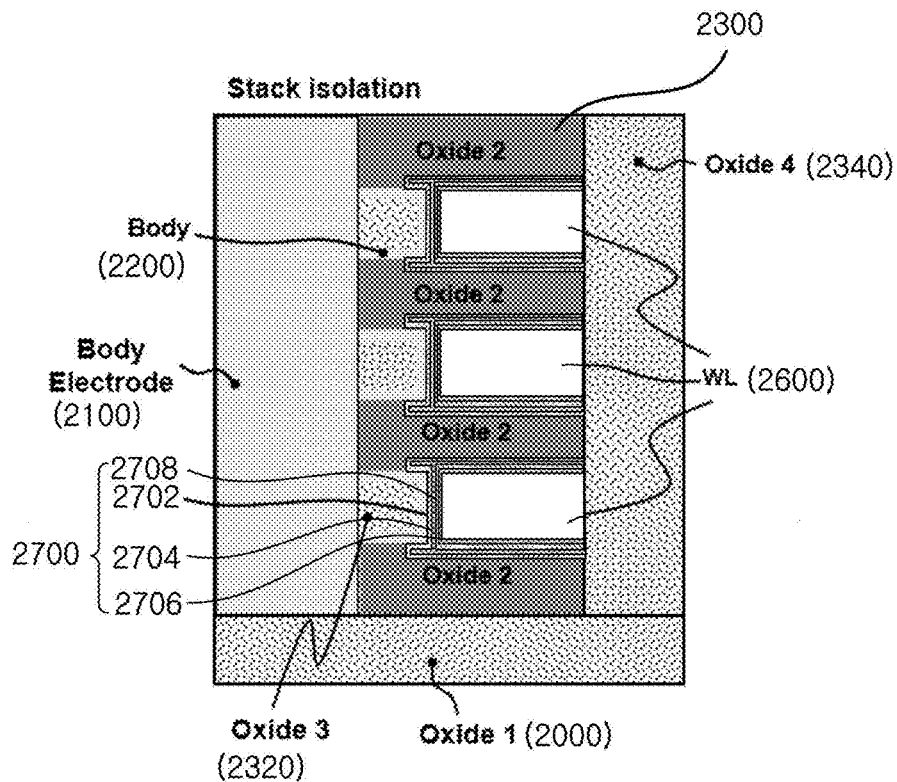
FIG. 18A and FIG. 18B are cross-sectional views of the 3D synaptic device stack shown in FIG. 17 in first and second directions in the second embodiment of the 3D synaptic device stack according to the present invention.
Figure 18B:
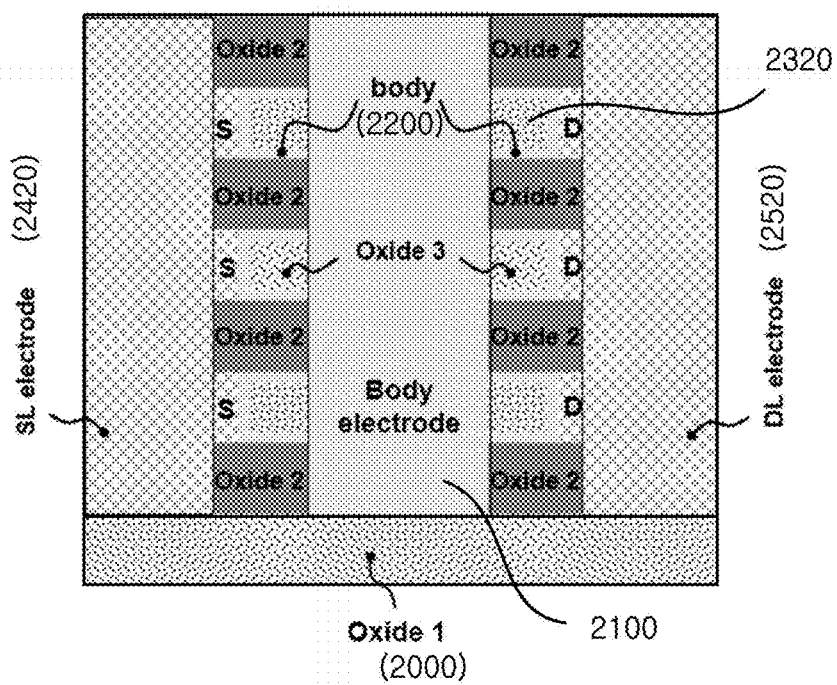

FIG. 17 is a horizontal cross-sectional view of a second embodiment of the three-dimensional synaptic device stack according to the present invention, and FIGS. 18A and 18B are cross-sectional views of FIG. 17 in first and second directions.

Hereinafter, the structure and operation of the second embodiment of the 3D synaptic device stack according to the present invention will be described in detail with reference to FIGS. 17 and 18A and 18B. Referring to FIGS. 17 and 18A and 18B, the 3D synaptic device stack 21 according to the present invention includes a substrate (not shown), a body electrode 2100, a semiconductor body 2200, a plurality of first insulating layers 2300, a plurality of third oxide layers 2320, a plurality of sources 2400, a plurality of drains 2500, a source electrode line 2420, a drain electrode line 2520, a plurality of word lines 2600 and a plurality of insulating layer stacks 2700.

A semiconductor body, a source, a drain, an insulating layer stack, and a word line located on the same layer of the outer circumferential surface of the body electrode constitute a synaptic device. The synaptic devices are electrically isolated from each other by the first insulating layers. A plurality of synaptic devices electrically isolated from each other by the first insulating layers are vertically stacked on the outer circumferential surface of the body electrode to form one stack structure.

On the other hand, the three-dimensional synaptic device stack according to the present invention can further include an additional stack structure having the same structure as the stack structure on the outer circumferential surface of the body electrode to improve the degree of integration. The additional stack structure includes additional word lines and additional insulating layer stacks, and is configured to share the sources, the drains, the source line electrode, and the drain line electrode of the stack structure. The 3D synaptic device stack having the above structure is electrically isolated from adjacent 3D synaptic device stacks by further including a fourth oxide layer 2340 on the side surfaces of the word lines.

Hereinafter, each component described above will be described in detail.

The substrate (not shown) has a surface formed of a first oxide layer (Oxide 1) 2000, and the three-dimensional synaptic device stack according to the present invention is provided along the vertical direction on the first oxide layer of the substrate.

The body electrode 2100 is disposed on the surface of the substrate, is provided in the shape of a pillar along a direction perpendicular to the surface of the substrate, and is made of a conductive material. Meanwhile, the body electrode is in contact with and electrically connected to the semiconductor body. A conductive material used as the body electrode may be a metal having electrical conductivity, a semiconductor material doped with impurities at a high concentration, or the like.

The plurality of first insulating layers (Oxide 2) 2300 and the plurality of third oxide layers (Oxide 3) 2320 are disposed on the outer circumferential surface of the body electrode and are alternately stacked on the outer circumferential surface of the semiconductor body in a vertical direction. The first insulating layer may be composed of, for example, an oxide layer. The first insulating layers and the third oxide layers electrically isolate the stacked synaptic devices from each other.

The semiconductor body (Body) 2200 is disposed on the outer circumferential surface of the body electrode and the surface of the third oxide layer. The semiconductor body may be formed by coating a semiconductor material in the form of a thin layer on the outer circumferential surface of the body electrode and the surface of the third oxide layer. The semiconductor body may be made of a semiconductor material such as polysilicon, polySiGe, or metal oxide. The semiconductor body 2200 having the above structure is configured to form a channel during device operation.

The plurality of sources(S) 2400 are disposed on the outer circumferential surface of the semiconductor body located on the first side surface of the body electrode, and are alternately stacked with first insulating layers located on the first side surface. The plurality of drains (D) 2500 are disposed on the outer circumferential surface of a semiconductor body located on the second side surface of the body electrode opposite to the first side surface along a second direction, and are alternately stacked with first insulating layers located on the second side surface.

The word lines (WL) 2600 are disposed on the outer circumferential surface of the semiconductor body located on the third and fourth side surfaces of the body electrode, and are alternately stacked with the first insulating layers located on the third and fourth side surfaces. Here, the third side and the fourth side of the body electrode are opposite to each other along the first direction, and are regions located between the first side with the sources and the second side with the drains. Here, word lines disposed on the third side and word lines disposed on the fourth side configure different stack structures.

The insulating layer stack (Insulator stack) 2700 is provided at least between the semiconductor body and the word line, and may be further provided between the first insulating layer and the word line. Referring to FIG. 18, the insulating layer stack 2700 includes a charge trap layer 2702, an insulating layer 2704, and a ferroelectric layer 2706. The structure of the insulating layer stack is formed of the same structure as the insulating layer stack of the synaptic device according to the present invention described above.

Meanwhile, in second embodiment of the 3D synaptic device stack according to the present invention, another embodiment of the insulating layer stack further includes a floating layer 2708 between the insulating layer 2704 and the ferroelectric layer 2706. Here, it is preferable that the capacitance between the WL and the floating layer is increased and the capacitance between the floating layer and the semiconductor body is decreased. This is a preferable structure when the ferroelectric layer is formed of two or more layers and the polarization is weak.

Along the first direction, a plurality of word lines and a plurality of first insulating layers are alternately stacked on the outer circumferential surface of the semiconductor body located on the third and fourth side surfaces of the body electrode. In addition, along the second direction, a plurality of sources and a plurality of the first insulating layers are alternately stacked on the outer circumferential surface of the semiconductor body located on the first side surfaces of the body electrode. In addition, along the second direction, a plurality of drains and a plurality of the first insulating layers are alternately stacked on the outer circumferential surface of the semiconductor body located on the second side surfaces of the body electrode. In this case, the semiconductor bodies in the first direction and the second direction are connected to each other, and word lines surrounded by the insulating layer stack are positioned between the sources and the drains.

The source line electrode (SL) 2420 is disposed at a predetermined distance from the first side of the outer circumferential surface of the body electrode, and has a pillar shape provided along the vertical direction on the substrate. A side surface of the source line electrode is in contact with and electrically connected to side surfaces of the plurality of sources. The drain line electrode (DL) 2520 is disposed at a predetermined distance from the second side of the outer circumferential surface of the body electrode and has a pillar shape provided along a vertical direction on the substrate. A side surface of the drain line electrode is in contact with and is electrically connected to the plurality of drains.

The source line electrode and the drain line electrode are made of a conductive material. As the conductive material, one of a metal having electrical conductivity and a semiconductor material doped with impurities at a high concentration may be used. The insulating layer stacks 2700 are provided at least between the word lines and the semiconductor body, and may be further provided between the word line and the first insulating layer.

According to the structure having the above configuration, the semiconductor body, the source, the drain, the insulating layer stack, and the word line located on the same layer of the outer circumferential surface of the body electrode constitute a synaptic device or a part thereof. In addition, the synaptic devices formed on each layer are stacked while being electrically isolated from each other by the first insulating layers, thereby constituting a three-dimensional synaptic device stack as a whole.

In addition, the additional insulating layer stack and the additional word line provided on the same layer of the outer circumferential surface of the body electrode share the semiconductor body, the source, the drain, the source line electrode, and the drain line electrode to form an additional synaptic device or a part thereof. In addition, the additional synaptic devices formed on each layer are stacked while being electrically isolated from each other by the first insulating layers, thereby constituting an additional stack structure as a whole.

Accordingly, two synaptic devices sharing a source and a drain may be formed on the same layer on the outer circumferential surface of the body electrode, and two synaptic device stacks separated from each other may be provided on the outer circumferential surface of the body electrode. The present invention can provide a basic synaptic device structure that can be effectively implemented in a three-dimensional stack structure, and the degree of integration can be improved by the above structure, and the performance of the device can also be improved. The 3D synaptic device stack having the above-described structure can be applied to various array architectures, and can be preferably applied to an AND-type synapse array architecture or a NOR-type synapse array architecture.

In the above, the present invention has been described with respect to the preferred embodiment thereof, but this is only an example and does not limit the present invention. It will be appreciated that various modifications and applications not exemplified above are possible within the scope. In addition, the differences related to such modifications and applications should be construed as being included in the scope of the present invention defined in the appended claims.

What is claimed is:

1. A ferroelectric-based synaptic device having a source, a drain, a semiconductor body in which a channel region is formed, a gate electrode, and an insulating layer stack disposed between the semiconductor body and the gate electrode,
wherein the insulating layer stack includes:
a charge trap layer made of a material capable of storing or trapping charges and disposed on the channel region of the semiconductor body;
a ferroelectric layer made of a ferroelectric material; and
an insulating layer disposed between the charge trap layer and the ferroelectric layer, and
wherein weight information of the ferroelectric-based synaptic device is temporarily stored in the charge trap layer and non-volatilely stored in the ferroelectric layer, and
wherein the insulating layer stack does not include a tunneling insulating layer between the channel of the semiconductor body and the charge trap layer.

2. The ferroelectric-based synaptic device according to claim 1, wherein the insulating layer stack further includes a floating layer disposed between the insulating layer and the ferroelectric layer, and the floating layer is composed of a material capable of storing or trapping charges and is electrically floating.

3. The ferroelectric-based synaptic device according to claim 1, wherein the ferroelectric layer is composed of a single ferroelectric layer or two or more ferroelectric layers.

4. The ferroelectric-based synaptic device according to claim 3, wherein the ferroelectric layer includes:
first and second ferroelectric layers made of hafnium zirconium oxide (HZO); and
a third ferroelectric layer made of hafnium oxide or zirconium oxide and disposed between the first and second ferroelectric layers.

5. The ferroelectric-based synaptic device according to claim 1, wherein the insulating layer stack further includes an additional charge trap layer made of a material capable of storing or trapping charges and disposed between the insulating layer and the charge trap layer, and
the charge trap layer and the additional charge trap layer are made of materials having different dielectric constants in order to adjust the electric field distribution between the gate electrode and the channel region.

6. The ferroelectric-based synaptic device according to claim 1, wherein the insulating layer stack further includes an additional charge trap layer made of a material capable of storing or trapping charges and disposed between the insulating layer and the charge trap layer, and
the charge trap layer and the additional charge trap layer are configured that energy depths of traps for storing charges are different from each other on order to have different charge storage characteristics.

7. The ferroelectric-based synaptic device according to claim 1, wherein the insulating layer stack further includes an additional insulating layer disposed between the insulating layer and the ferroelectric layer, and
the additional insulating layer is made of a material having a dielectric constant different from the insulating layer.

8. The ferroelectric-based synaptic device according to claim 1, wherein the insulating layer stack further comprises an additional insulating layer, and
the additional insulating layer is composed of a material capable of storing or trapping charges.

9. The ferroelectric-based synaptic device according to claim 1, wherein the source and drain are implemented by doping impurities to the surface of the semiconductor body or electrically induced in the surface of the semiconductor body.

10. The ferroelectric-based synaptic device according to claim 1, wherein the ferroelectric-based synaptic device is composed of a vertical structure or a horizontal structure, and
the semiconductor body is implemented in the form of a semiconductor thin layer or implemented in the form of an n-type or p-type semiconductor well or a semiconductor substrate.

11. A method of operating a ferroelectric-based synaptic device which comprises a source, a drain, a semiconductor body having a channel region, a gate electrode, and an insulating layer stack disposed between the semiconductor body and the gate electrode, wherein the insulating layer stack includes a charge trap layer made of a material capable of storing or trapping electric charges and disposed on the channel region, a ferroelectric layer made of a ferroelectric material, and an insulating layer disposed between the charge trap layer and the ferroelectric layer,
the method of operating a ferroelectric-based synaptic device comprises the following steps:
(a) storing charges corresponding to weight information of the ferroelectric-based synaptic device in the charge trap layer;
(b) applying a pulse voltage to the gate electrode;
(c) polarizing the ferroelectric layer according to the amount of charge stored in the charge trap layer by the pulse voltage applied to the gate electrode; and
(d) leaking the charges stored in the charge trap layer to the channel region, and
wherein charges corresponding to the weight information of the ferroelectric-based synaptic device are temporarily stored in the charge trap layer, and the weight information of the ferroelectric-based synaptic device is non-volatilely stored in the ferroelectric layer.

12. The method of operating a ferroelectric-based synaptic device according to claim 11, wherein the step (a) comprises the following steps:
(a1) moving or accumulating charges in the channel region of the semiconductor body according to the flow of current between the source and the drain; and
(a2) storing the charges of the channel region in the charge trap layer or transferring the charges of the charge trap layer to the channel region, and
wherein the charges corresponding to the weight information of the ferroelectric-based synaptic device are temporarily stored in the charge trap layer.

13. The method of operating a ferroelectric-based synaptic device according to claim 11, wherein the ferroelectric-based synaptic device further comprises a floating layer capable of storing charge between the ferroelectric layer and the insulating layer, and the floating layer is made of a material having a higher dielectric constant than the insulating layer, and
wherein the step (a) comprises the following steps:
(a1) temporarily storing the charges corresponding to the weight information of the synaptic device in the charge trap layer, and (a2) moving the charges of the charge trap layer to the floating layer through the insulating layer and storing the charges in the floating layer.

14. A synaptic array architecture characterized in that the ferroelectric-based synaptic devices according to claim 1 are arranged in an array form.

* * * * *